(12) United States Patent
Takiba

(10) Patent No.: US 7,208,979 B2
(45) Date of Patent: Apr. 24, 2007

(54) SIGNAL LEVEL CONVERSION CIRCUIT

(75) Inventor: Akira Takiba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 11/008,305

(22) Filed: Dec. 10, 2004

(65) Prior Publication Data

US 2005/0156630 A1    Jul. 21, 2005

(30) Foreign Application Priority Data

Dec. 15, 2003    (JP) ............................. 2003-416121

(51) Int. Cl.
*H03K 19/0175* (2006.01)
(52) U.S. Cl. ........................................ 326/83; 326/68
(58) Field of Classification Search ............ 326/68–74, 326/81–83, 86, 87
See application file for complete search history.

(56) References Cited

U.S. PATENT DOCUMENTS

| | | | |
|---|---|---|---|
| 4,988,894 A | 1/1991 | Takiba et al. | |
| 5,442,307 A | 8/1995 | Shigehara et al. | |
| 5,929,688 A | 7/1999 | Ueno et al. | |
| 6,359,470 B1 * | 3/2002 | Palusa .......................... | 326/70 |
| 6,400,206 B2 * | 6/2002 | Kim et al. ................... | 327/333 |
| 2004/0155679 A1 | 8/2004 | Takiba et al. | |
| 2005/0156630 A1 | 7/2005 | Takiba | |

FOREIGN PATENT DOCUMENTS

JP    8-335126    12/1996
JP    2000-269799    9/2000

OTHER PUBLICATIONS

U.S. Appl. No. 11/405,424, filed Apr. 18, 2006, Takiba.

* cited by examiner

*Primary Examiner*—Don Le
(74) *Attorney, Agent, or Firm*—Oblon, Spivak, McClelland, Maier & Neustadt, P.C.

(57) ABSTRACT

The signal level conversion circuit has a first terminal for a signal of a low power voltage; a second terminal for a signal of a high power voltage higher than the low power voltage; a level shifter which is disposed in a signal path from the first terminal to the second terminal to convert the low power voltage signal into the high power voltage signal; and a first input buffer including a first inverter of P1 and N1 whose gates are connected to the first terminal, and a one-way device between a voltage supply of the low power voltage and a source of P1. The level shifter includes second and third inverters which are interposed between an output of the first input buffer and the second terminal and which use the high power voltage and which are connected in series, an output of the first input buffer is supplied to an input of the second inverter and an output of the third inverter, and a circuit threshold value of the second inverter using the high power voltage is set to be lower than a voltage obtained by subtracting a voltage drop consumed by the one-way device from the low power voltage. A first logic circuit for calculating the signal of the low or high power voltage is disposed in a certain portion of the signal path, and a circuit threshold value of the first logic circuit is set to be lower than a voltage obtained by subtracting a voltage drop consumed by the one-way device from the low power voltage.

14 Claims, 19 Drawing Sheets

SIGNAL LEVEL CONVERSION CIRCUIT

CROSS REFERENCE TO RELATED APPLICATION

This application is based upon and claims the benefit of priority from the prior Japanese Patent Application No. 2003-416121, filed on Dec. 15, 2003, the entire contents of which are incorporated herein by reference.

BACKGROUND OF THE INVENTION

1. Field of the Invention

The present invention relates to a signal level conversion circuit, and more particularly, it relates to a signal level conversion circuit which converts a level of a signal from one power potential to the other power potential in a case where signals are transmitted/received between different power potentials.

2. Description of the Related Art

In general, in a system including a central processing unit (CPU), there exist a large number of bus (signal) lines via which data is exchanged between the CPU and various peripheral devices, and these various peripheral devices are connected to the bus as if they were hanging. With improvement of a processing capacity of the CPU, power consumption increases, and hence, processes are finely divided and a power voltage is lowered to suppress the increase of the power consumption. In the peripheral devices connected to the CPU, however, there has been a tendency that the lowering of the power voltage does not easily advance in many cases.

This tendency is often seen in battery drive apparatuses driven by batteries, and examples of the battery drive apparatus include applications such as cellular phones and personal digital assistants (PDA). In these applications, there has been a demand for a reduced power consumption in order to lengthen a use time, especially a demand for a low power consumption with respect to the CPU. However, in these peripheral apparatuses connected to a bus, it has been difficult to change the power voltage because of necessity of maintaining compatibility in the present situations. Therefore, signals having different power levels are supplied to the bus. However, when the signals having different power levels are supplied to the bus, current consumption of the system is increased, devices are broken, or malfunctions of the devices are caused. Therefore, an integrated circuit device for converting the power level of the signal is required. FIG. 22 is a block diagram showing a schematic constitution of a general signal level conversion circuit driven at different power levels. The block diagram shows a case where VccA<VccB is set.

A system 1 of a bidirectional level shifter shown in FIG. 22 includes a VccA system circuit 2 which operates at a power level A, and a VccB system circuit 3 which operates at a power level B. When a signal flows in a direction of an arrow 4 to a terminal B1 from a terminal A1, the system includes a first input buffer circuit 5, a level shifter circuit 6 which converts the level of a power supply, a first (A to B) logic circuit 7, and a first output buffer circuit 8. It is to be noted that in the block diagram of FIG. 22, the first logic circuit 7 is interposed between the level shifter circuit 6 and the first output buffer circuit 8 in the flow of the signal in the arrow 4 direction, but the first logic circuit 7 may be disposed in any signal path extending to terminal B from terminal A. For example, as shown in a dot-line block of FIG. 22, the first logic circuit may also be interposed between the first input buffer circuit 5 and the level shifter circuit 6 of the VccA system circuit 2.

Either of the VccA system circuit 2 and the VccB system circuit 3 to be operated is controlled by a control circuit 9. In the control circuit 9, an operation direction is switched to the direction of the arrow 4 or an arrow 10 by signals input from an input terminal DIR of a direction switching signal and an input terminal *OE of an operation signal. When the signal flows in the direction of the arrow 10 to the terminal A1 from the terminal B1, the system includes a second input buffer circuit 11, a second (B to A) logic circuit 12, and a second output buffer circuit 13. It is to be noted that "*" in the operation signal *OE means that the potential of the signal is reversed in this specification.

The system shown in FIG. 22 shows a case where the power level has a relation of VccA<VccB as described above. For example, considering that the terminal A1 is an input and the terminal B1 is an output, the signal which has entered the terminal A1 is inputted into the level shifter circuit 6 through the first input buffer circuit 5. After the level is converted to VccB from VccA in the level shifter circuit 6, and a predetermined logic operation is performed in the first logic circuit 7, a signal having a VccB level is outputted to the terminal B1 from the first output buffer circuit 8. The level shifter circuit 6 is inserted to securely turn off a P-channel transistor of the first output buffer circuit. When "VccA<VccB", and when the level shifter circuit 6 is not disposed, a voltage Vgs (voltage from gate to source) between gate and source of the P-channel transistor is not 0 V, the P-channel transistor does not turn off, and a through current is passed.

When the terminal B1 is an input and the terminal A1 is an output, the level shifter circuit does not have to be interposed between the second input buffer circuit 11 and the second (B to A) logic circuit 12, and the signal input from the terminal B1 is outputted as a signal of a VccA level to the terminal A1 via the second input buffer circuit 11, second (B to A) logic circuit 12, and second output buffer circuit 13.

A concrete constitution of a conventional system shown in FIG. 22 will be described with reference to a circuit diagram of FIG. 23. In FIG. 23, the terminal *OE having the VccB level brings both the terminals A and B into a high impedance (HZ) state. When the terminal *OE has a ground (GND) level, the terminal A, B is set to be the input or the output. The terminal DIR having the VccB level uses the terminal A as the input, and the terminal B as the output. When the terminal DIR has a ground (GND) level, the terminal B is set to the input, and the terminal A is set to the output.

Now an operation in an example in which the terminal A is the input and the terminal B is the output (i.e., *OE=GND, DIR=VccB) will be described. When a signal having the VccA level is inputted into the terminal A, a node α has a GND level, N2, P1 of the level shifter circuit 6 turn on, N1, P2 turn off, the VccB level is outputted to a node β, and the level can be converted to VccB from VccA.

However, since the number of devices forming the circuit is large in the constitution of the prior-art level shifter circuit in the bidirectional system shown in FIG. 23, there has been a disadvantage that a chip size increases. Moreover, since the constitution includes six stages in total including the first input buffer circuit 5 (first stage), level shifter circuit 6 (second, third stages), first (A, B) logic circuit 7 (fourth stage), and first output buffer circuit 8 (fifth, sixth stages), a propagation time of the signal is delayed, and there is also a problem that delay is generated in the signal propagation.

It is to be noted that as a bus system operating at different power levels, not only the bidirectional system shown in FIGS. 22, 23 but also a one-way system shown in FIG. 24 are used. A second prior art which is the one-way system will be described with reference to FIG. 24.

A basic constitution of the one-way system shown in FIG. 24 corresponds to that of the bidirectional system of FIG. 23 except that the terminal DIR for inputting the direction switching signal to control a processing direction of the signal is not disposed. Therefore, the same constituting elements are denoted with the same reference numerals, and redundant description is omitted. It is to be noted that even in the one-way system shown in FIG. 24, the power voltage has a relation of VccA<VccB, and the operation of the one-way system is the same as that in a case where the signal is processed to the terminal B from the terminal A in the bidirectional system. Since the one-way system does not include the terminal DIR, there is not any complexity of the control as in the bidirectional system. However, the circuit constitution is still complicated, and there is a problem that the chip size increases in the same manner as in the bidirectional system. Furthermore, the problem that the delay is generated in the signal propagation time also occurs in the same manner as in the bidirectional system.

As described above, according to the conventional signal level conversion circuit, the level shifter circuit includes a two-stage constitution, whether the signal processing system is one-way or bidirectional. Therefore, the circuit constitution becomes complicated, and there has been a problem that the chip size increases. The delay is generated in the signal propagated through the signal processing system in which the level shifter circuit including a large number of stages is disposed. There is also a problem that the signal propagation in a signal processing direction from a terminal side on which the signal level is low to that on which the signal level is high is delayed. According to the present invention, there is provided a signal level conversion circuit in which the number of stages of a signal processing system including a level shifter circuit is decreased to simplify a circuit constitution, so that a chip size can be decreased, and a delay in signal propagation can be reduced.

SUMMARY OF THE INVENTION

According to a basic aspect of the present invention, a signal level conversion circuit has voltage sources for supplying a first power voltage higher than a predetermined reference voltage and a second power voltage higher than the first power voltage, respectively, and comprises at least a first terminal for a signal of the first power voltage, a second terminal for a signal of the second power voltage, and a level shifter circuit which is disposed in a signal path between the first terminal and the second terminal to convert the signal of the first power voltage having a different voltage into the signal of the second power voltage, the circuit further comprising a first input buffer circuit comprising a first inverter including a first P-channel transistor and a first N-channel transistor whose gates are connected to the first terminal, and a one-way device which is interposed between the first P-channel transistor and the first power voltage and which supplies a current from the first power voltage to a source of the first P-channel transistor; and the level shifter circuit comprising second and third inverters which are interposed between an output of the first input buffer circuit and the second terminal and which use the second power voltage and which are connected in series, an input of the second inverter and an output of the third inverter being connected to an output of the first input buffer circuit, wherein a circuit threshold value of the second inverter is set to be lower than a voltage obtained by subtracting a voltage drop of the one-way device from the first power voltage.

DESCRIPTION OF THE EMBODIMENTS

Embodiments of a signal level conversion circuit according to the present invention will be described hereinafter in detail with reference to the accompanying drawings. It is to be noted that in first to tenth embodiments, an example of the signal level conversion circuit will be described in a one-way signal path in a case where a signal input into a terminal A of a VccA system whose power voltage is low is level-shifted and supplied to a terminal B of a VccB system whose power voltage is high. In eleventh to twentieth embodiments, an example of a bidirectional signal level conversion circuit will be described including a first signal path having the terminal A as an input terminal and the terminal B as an output terminal, and a second signal path having the terminal B as the input terminal and the terminal A as the output terminal.

First Embodiment

Figure 1:
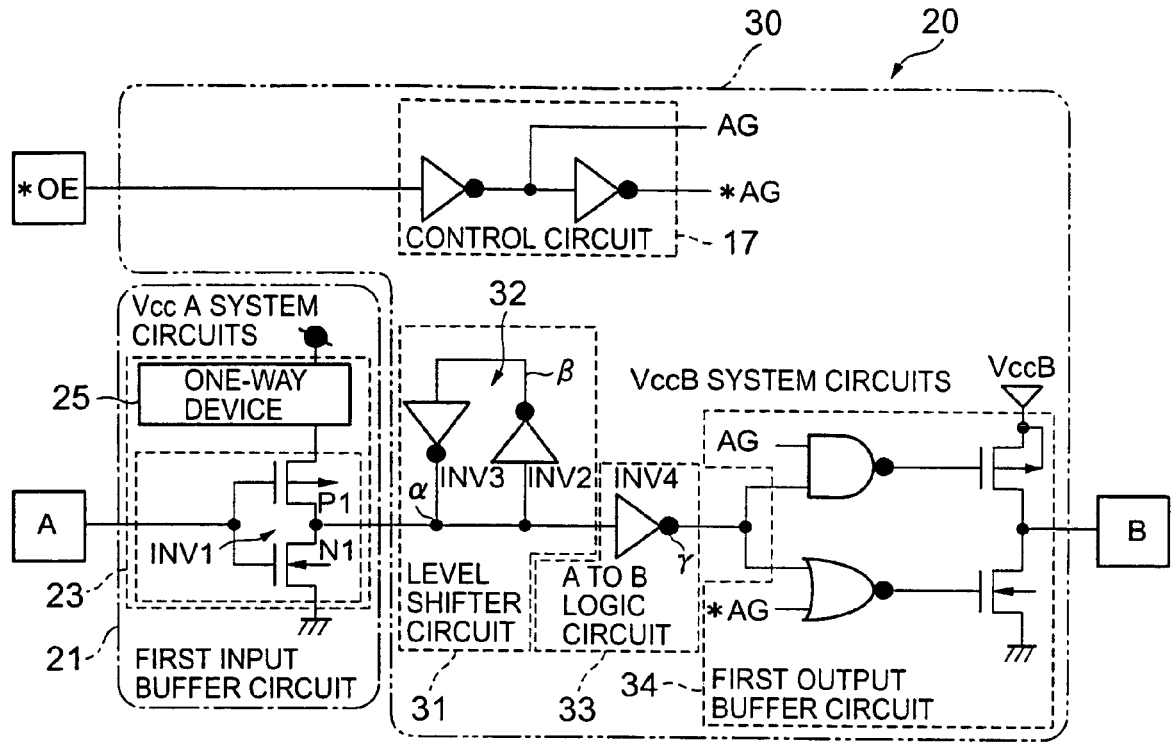
FIG. 1 is a circuit block diagram showing a constitution of a signal level conversion circuit according to a first embodiment of the present invention.
Figure 2:
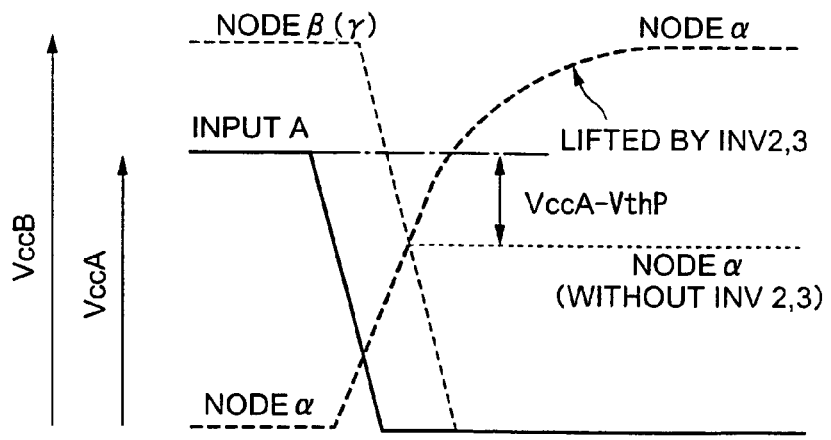
FIG. 2 is a characteristic diagram showing a basic operation of the circuit according to the first embodiment.

First, a signal level conversion circuit according to a first embodiment which is a most basic constitution of the present invention will be described with reference to FIGS. 1, 2. FIG. 1 is a block diagram showing a constitution of a one-way signal level conversion circuit. A signal level conversion circuit 20 of FIG. 1 includes a VccA system circuit 21 and a VccB system circuit 30 including voltage sources for supplying a first power voltage VccA higher than a predetermined reference voltage and a second power voltage VccB higher than the first power voltage VccA, respectively. Between a first terminal A for a signal input of the first power voltage VccA and a second terminal B for a signal output of the second power voltage VccB, the circuit includes at least: a first input buffer circuit 23 of the VccA system; a level shifter circuit 31 of the VccB system which is disposed in a signal path between the first terminal A and the second terminal B to convert a signal of the first power voltage having a different voltage into a signal of the second power voltage; and a first (A to B) logic circuit 33 which is disposed in the signal path and which logically calculates/processes the signal of the first power voltage VccA or the second power voltage VccB. A first output buffer circuit 34 is connected between the first logic circuit 33 and the terminal B.

The first input buffer circuit 23 includes: a first inverter INV1 constituted of a first P-channel transistor P1 and a first N-channel transistor N1 whose gates are connected to the first terminal A; and a one-way device 25 interposed between the source of the first P-channel transistor P1 of the first inverter INV1 and the first power voltage. Between an output of the first input buffer circuit 23 and the second terminal B, the level shifter circuit 31 is disposed including a series inverter circuit 32 constituted of second and third inverters INV2, INV3 in which the second power voltage is used. A circuit threshold value of the second inverter INV2 of the series inverter circuit 32 using the second power voltage is set to be lower than a voltage obtained by subtracting a power drop consumed by the one-way device 25 from the first power voltage. A circuit threshold value of the first logic circuit 33 is also set to be lower than a voltage obtained by subtracting a power drop consumed by the one-way device 25 of the first input buffer circuit 23 from the first power voltage.

The level shifter circuit 31, first logic circuit 33, and first output buffer circuit 34 constitute the VccB system circuit 30 together with a control circuit 17 which produces a control signal of the first output buffer circuit 34 from an operation signal *OE of the VccB system. It is to be noted that an alphabet "A" in control signals AG, *AG output to the first output buffer circuit 34 from the control circuit 17 does not indicate the voltage level of the signal. It is indicated that a direction in which the signals are processed in the circuit is a direction from the terminal A to the terminal B. Therefore, in a bidirectional signal processing circuit (described later) having a path of the signal processing in the direction from the terminal B to the terminal A, control signals BG, *BG are supplied to a second output buffer.

In the signal level conversion circuit according to the first embodiment, a signal supply path whose terminal A is the input and whose terminal B is the output is interposed between opposite terminals. An operation in this case will be described. In the circuit constitution, the one-way device 25 which supplies a current to P1 from VccA is interposed between the first P-channel transistor P1 constituting the first inverter INV1 of the first input buffer circuit 21 and the first power voltage VccA. As the level shifter circuit 31, the series inverter circuit 32 is disposed whose power supply is VccB and in which the second and third inverters INV2, INV3 are connected in series, and the circuit transmits an output to the terminal B via the A to B logic circuit 33 and the first output buffer circuit 34. As a concrete constitution of the one-way device 25, a diode-connected second P-channel transistor P2 may also be disposed as in a second embodiment, or a diode D1 may also be connected as in a third embodiment.

When a signal having a GND level is inputted into the first terminal A, an output node a of the first input buffer circuit 23 indicates a value obtained by subtracting a voltage drop of the one-way device 25 from VccA. Therefore, when the one-way device 25 is constituted of a P-channel transistor, a value of the node α is "VccA-VthP" (VthP is a threshold value of the P-channel transistor of the one-way device). When the one-way device is constituted of a diode device, the value of the node α is "VccA-VF" (VF is a forward voltage of the diode). Upon receiving this voltage, a fourth inverter INV4 constituting the first (A to B) logic circuit 33 outputs the GND level to a node Ξ, and outputs the GND level to the terminal B. Here, the circuit threshold value of the second inverter INV2 of the level shifter circuit 31 and the fourth inverter INV4 of the A to B logic circuit 33 needs to be "VccA-VthP" or "VccA-VF" or less. The reason is that when the circuit threshold value of the inverters INV2, INV4 is larger than "VccA-VthP" or "VccA-VF", and even when the node a indicates "VccA-VthP" or "VccA-VF", the second and fourth inverters INV2, INV4 do not reverse, and therefore the circuit does not operate.

When the input of the fourth inverter INV4 remains to be "VccA-VthP" or "VccA-VF", Vgs (voltage between gate and source) of the first P-channel transistor P1 constituting the first inverter INV1 has a relation of VccA<VccB, the value does not turn to zero, and the P-channel transistor P1 continues to turn on, and the through current is passed through the fourth inverter INV4 constituting the first logic circuit 33. To prevent this, the second and third inverters INV2, INV3 in which VccB is used as the power supply are connected in series, and connected to the node α. Accordingly, when the node α indicates "VccA-VthP" or "VccA-VF", the node β is set to GND by the second inverter INV2. When the fourth inverter INV4 outputs VccB, the node α is lifted to the second power voltage VccB to shift the level. The reason why the one-way device 25 is disposed in the first input buffer circuit 23 is that when the node α indicates the second power voltage VccB, the voltage does not flow backwards with respect to the first power voltage VccA. A state of the potential in each node is shown in FIG. 2.

Figure 23:
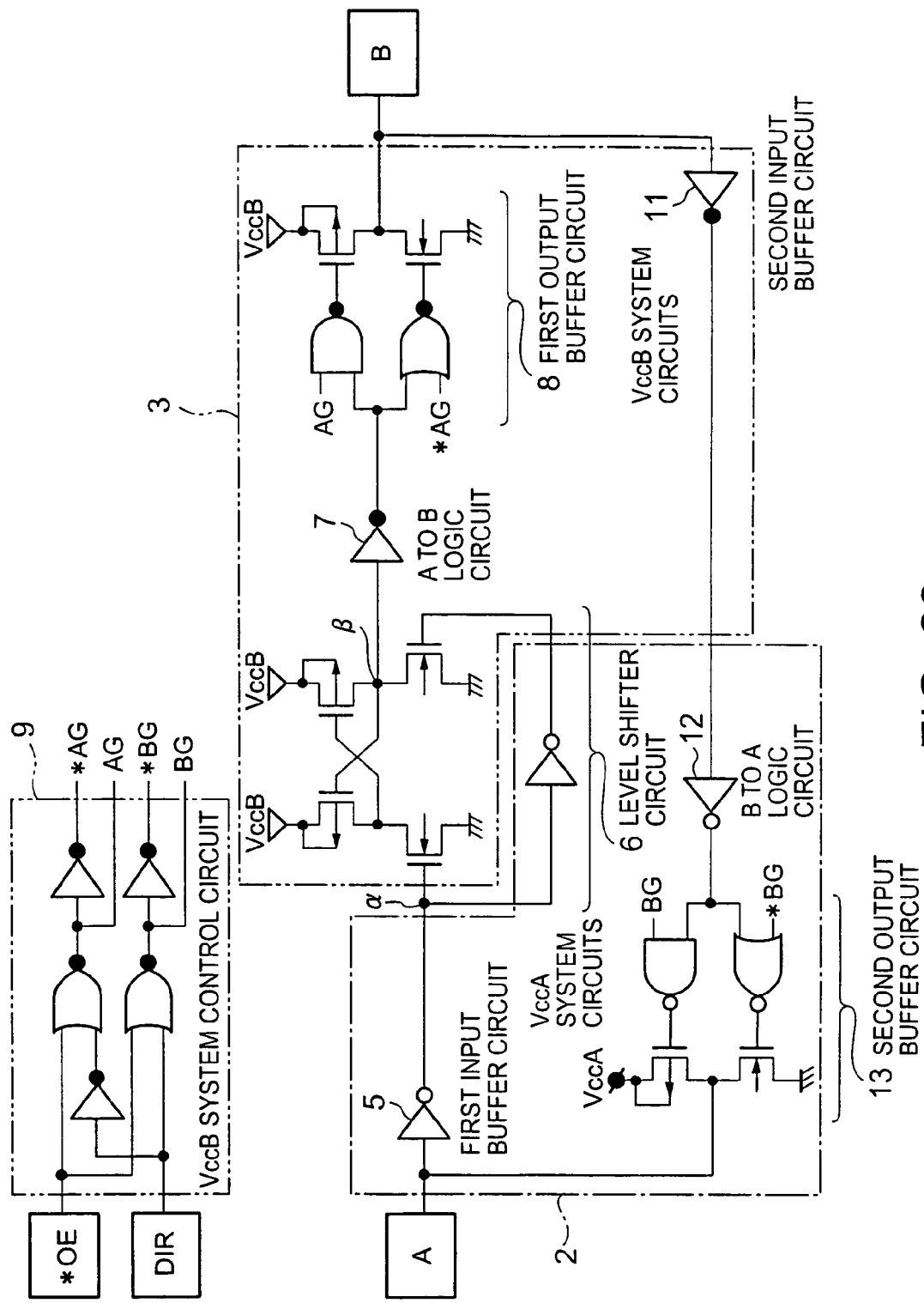
FIG. 23 is a block diagram showing a signal level conversion circuit including a conventional bidirectional signal path.
Figure 24:
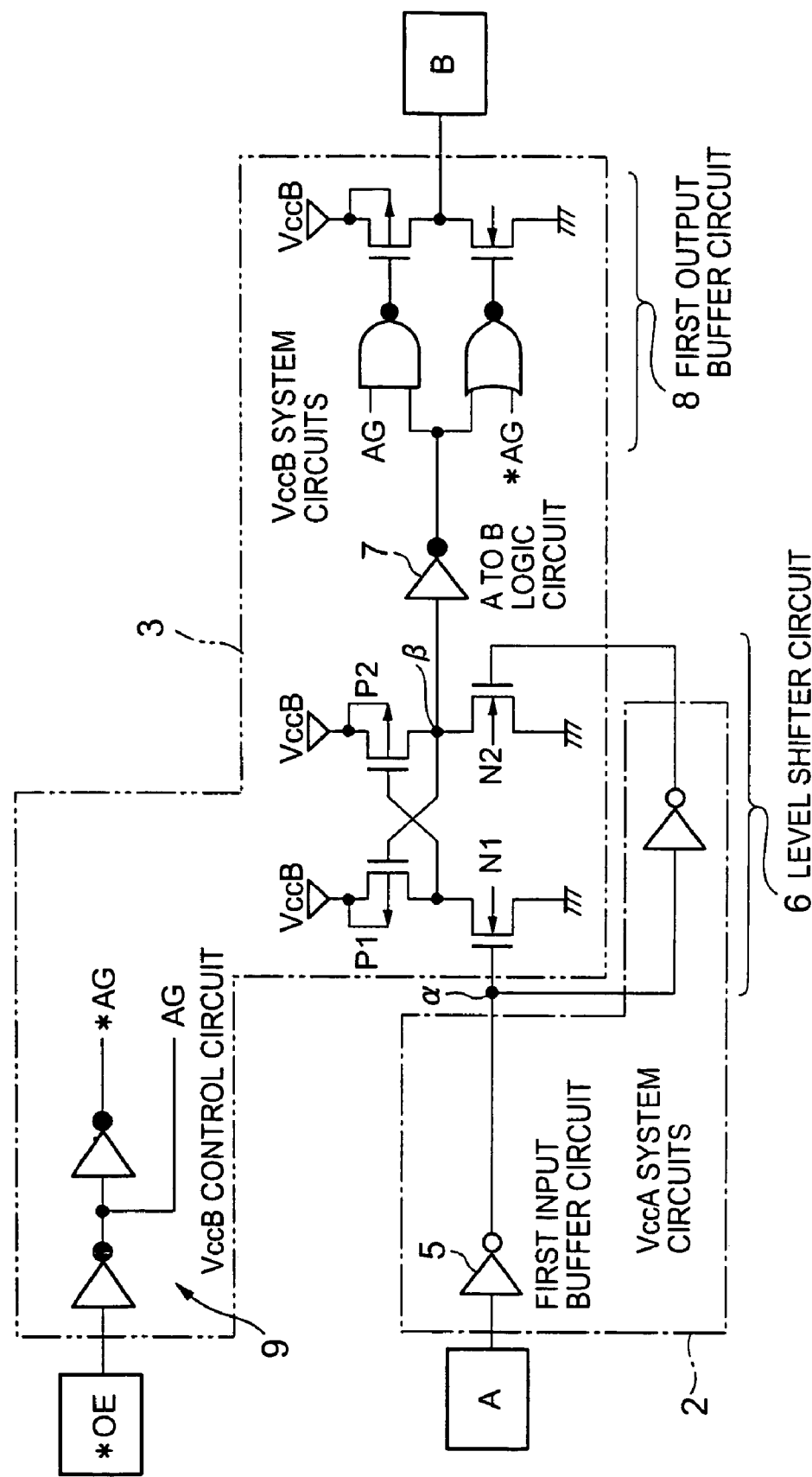
FIG. 24 is a block diagram showing a signal level conversion circuit including a conventional one-way signal path.

Conversely, when the signal having a level of the first power voltage VccA is inputted into the first terminal A, the node a has a GND level, the node γ (also the node β) is at the second power voltage VccB level, and the second power voltage VccB is outputted to the second terminal B. The inverter series stage 32 constituted of the second and third inverters INV2, INV3 connected to the node α only lifts the level, and the size may be small. Accordingly, the constitution of the level shifter circuit 31 is simplified, and the chip size can be reduced. The number of stages which the signal passes through may be, for example, four in the first embodiment. The number of stages decreases, for example, as compared with six stages in the prior art shown in FIG. 23, and the circuit may also be speeded up.

Second Embodiment

Figure 3:
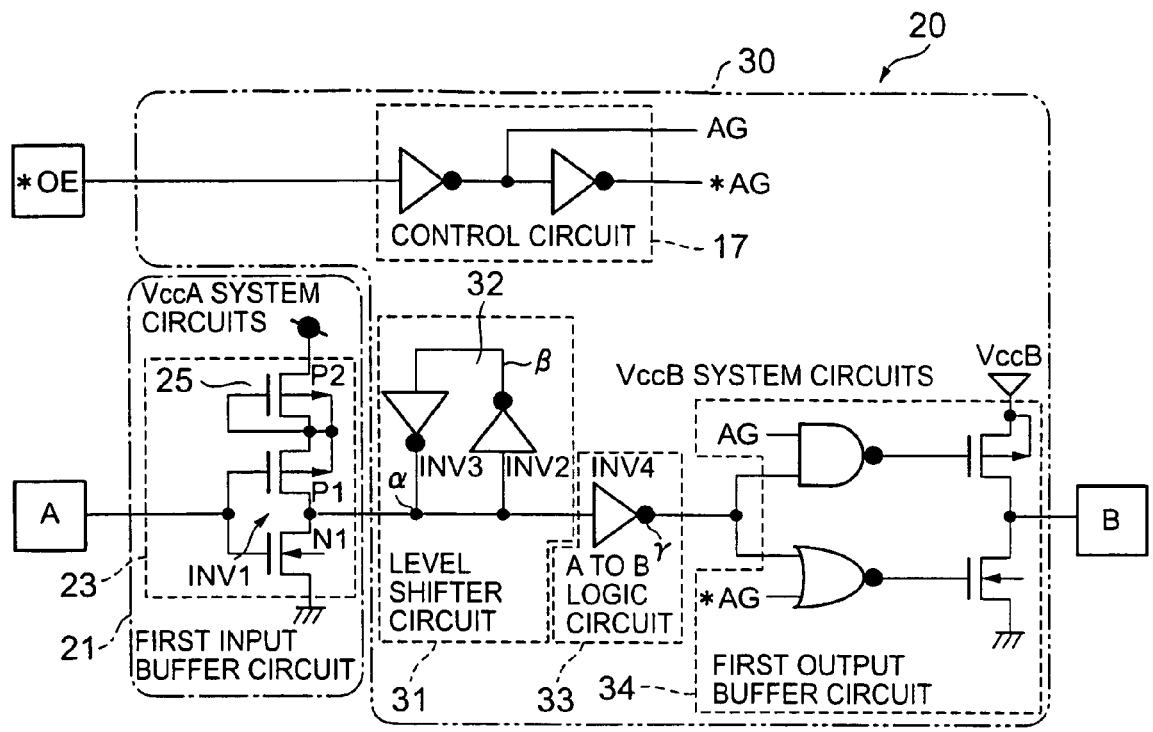
FIG. 3 is a circuit block diagram showing a constitution of the signal level conversion circuit according to a second embodiment of the present invention.

As shown in FIG. 3, a signal level conversion circuit 20 according to a second embodiment provides a concrete constitution example of a one-way device 25 disposed in a first input buffer circuit 23. That is, the one-way device 25 is constituted of a P-channel transistor P2 diode-connected between a source of a P-channel transistor P1 constituting the first inverter INV1 and a power terminal of a first power voltage VccA system. Therefore, in the second embodiment, the node α indicates a value of "VccA-VthP".

Since the constitution is similar to that of the signal level conversion circuit of the first embodiment shown in FIG. 1 except that the second P-channel transistor P2 is provided as the one-way device 25, redundant description is omitted. The second P-channel transistor P2 in the second embodiment is a concrete example of the one-way device 25 in the first embodiment, and produces a function/effect similar to that described in the signal level conversion circuit in the first embodiment.

Third Embodiment

Figure 4:
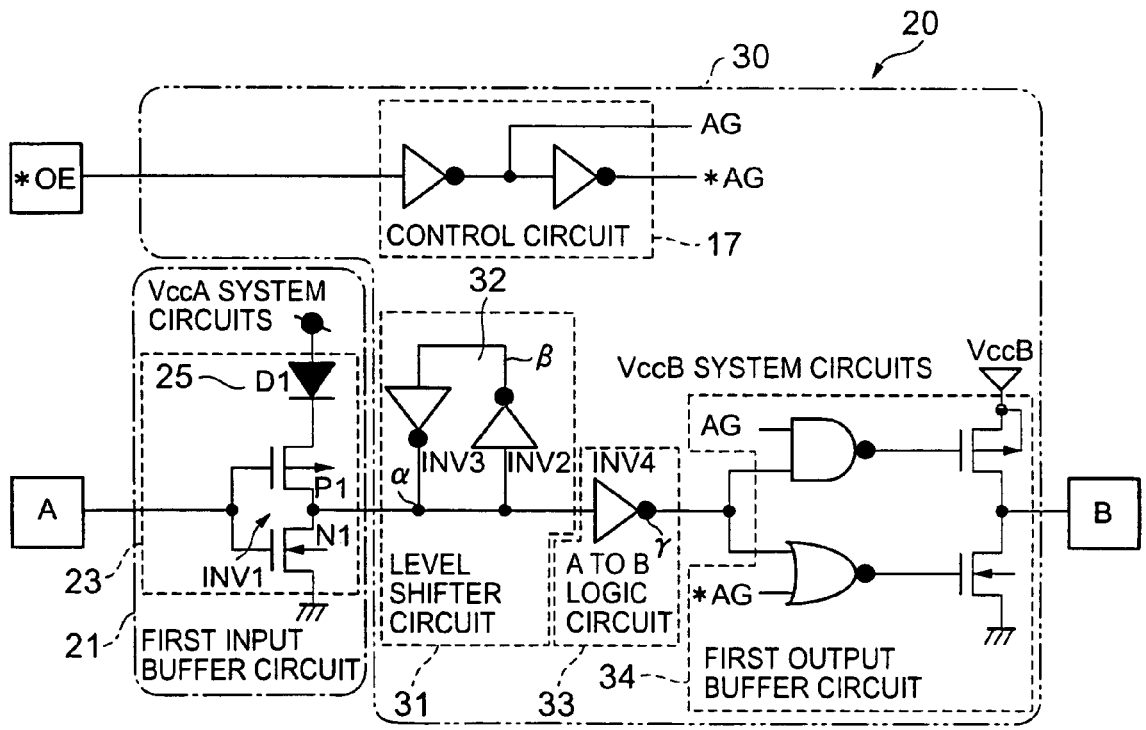
FIG. 4 is a circuit block diagram showing a constitution of the signal level conversion circuit according to a third embodiment of the present invention.

As shown in FIG. 4, in a concrete constitution of a signal level conversion circuit 20 according to a third embodiment, as a concrete example of a one-way device 25 disposed in a first input buffer circuit 23, a diode D1 is disposed as the one-way device between a source of a P-channel transistor P1 constituting a first inverter INV1 and a power terminal of a first power voltage VccA system.

Since the constitution is similar to that of the signal level conversion circuit of the first embodiment shown in FIG. 1 except that the one-way device 25 is embodied by the diode D1, redundant description is omitted. Additionally, since the one-way device 25 is constituted of the P-channel transistor P2 in the second embodiment, the value of the output node a is (VccA-VthP). In the third embodiment, since the diode D1 is used as the concrete example of the one-way device 25 in the first embodiment, the value of the output node α is (VccA-VF). Since the other constitution is the same, a function/effect similar to that described in the signal level conversion circuit of the first embodiment is produced.

Fourth Embodiment

In the signal level conversion circuit according to the first to third embodiments, the level shifter circuit 31 is constituted of the second and third inverters INV2, INV3, and the first logic circuit 33 is constituted of the fourth inverter INV4, but the present invention is not limited to this, and a function of the second inverter INV2 of the level shifter circuit 31 may be substituted by the fourth inverter INV4 constituting the first logic circuit 33. As an example constituted in this manner, there is provided a signal level conversion circuit according to fourth to sixth embodiments.

Figure 5:
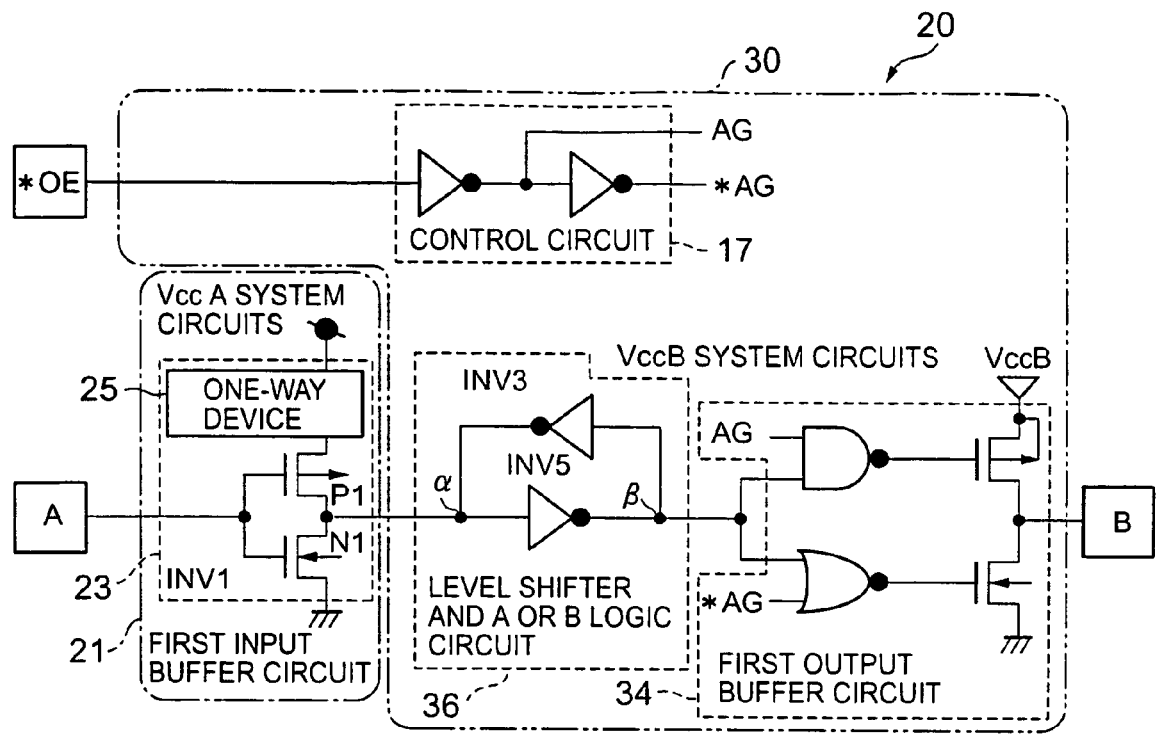
FIG. 5 is a circuit block diagram showing a constitution of the signal level conversion circuit according to a fourth embodiment of the present invention.

As shown in FIG. 5, a signal level conversion circuit 20 according to the fourth embodiment includes a first input buffer circuit 23 of a VccA system circuit 21, and a VccB system circuit 30. A fifth inverter INV5 connected in series in a forward direction between nodes α and β in a signal path of the VccB system circuit 30, and a third inverter INV3 connected in parallel and in reverse from node β to α constitute a level shifter and A to B logic circuit 36. As described above, the fifth inverter INV5 functions both as the second inverter INV2 of the level shifter circuit 31 in the first to third embodiments, and the fourth inverter INV4 of the first (A to B) logic circuit 33. By this constitution, a circuit scale can further be simplified, and reduction of a chip size or enhancement of a signal processing rate can further be promoted. The threshold value of the fifth inverter INV5 is lower than that of the voltage drop.

Fifth Embodiment

Figure 6:
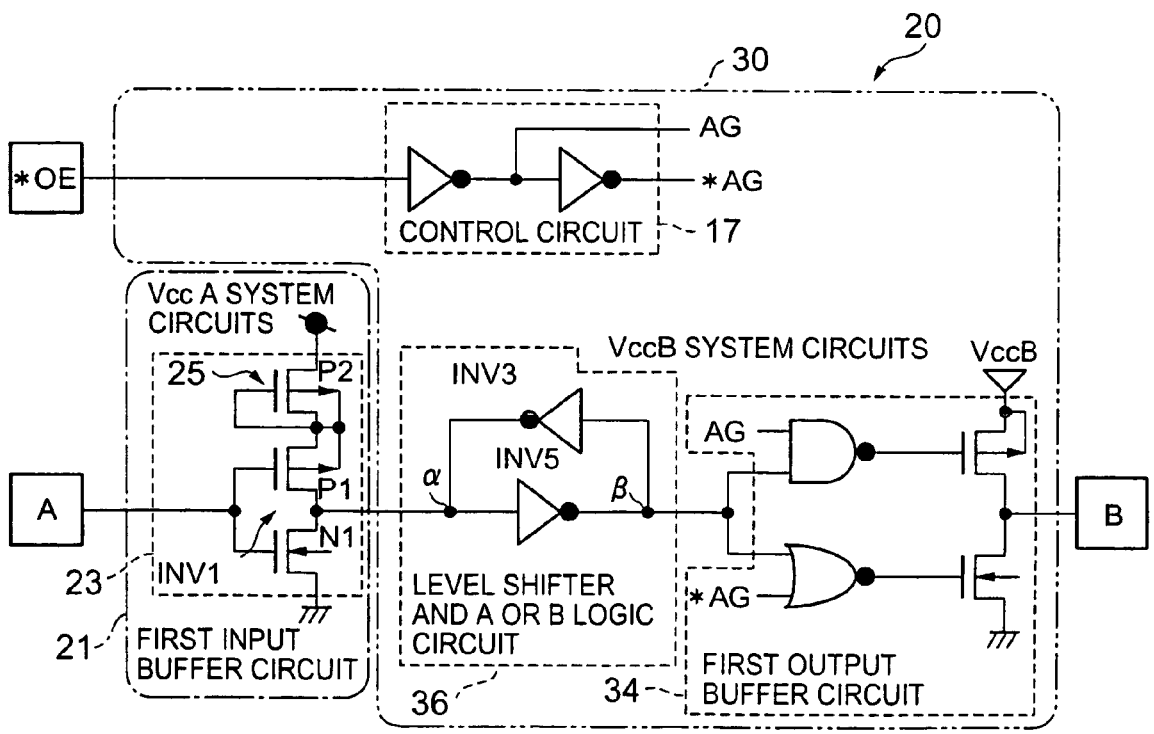
FIG. 6 is a circuit block diagram showing a constitution of the signal level conversion circuit according to a fifth embodiment of the present invention.

In a fifth embodiment shown in FIG. 6, as a concrete constitution of the one-way device 25 in the signal level conversion circuit of the fourth embodiment, a second P-channel transistor P2 is interposed between a source of a first P-channel transistor P1 in a first inverter INV1 and a first power voltage VccA. Therefore, an operation of a first input buffer circuit 23 is similar to that of the second embodiment, and an operation of a level shifter and A to B logic circuit 36 is similar to that of the signal level conversion circuit according to the fourth embodiment. Other constituting elements that are the same as or correspond to those of the signal level conversion circuit according to the first to fourth embodiments are denoted with the same reference numerals, and redundant description is omitted.

Sixth Embodiment

Figure 7:
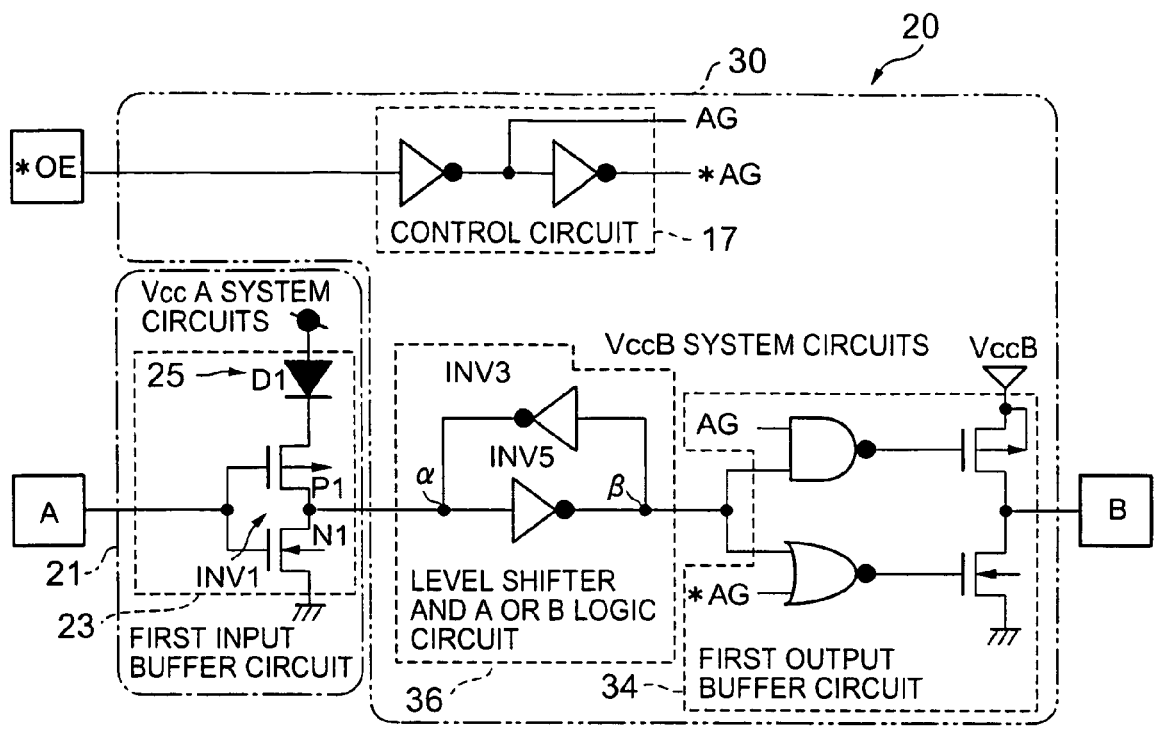
FIG. 7 is a circuit block diagram showing a constitution of the signal level conversion circuit according to a sixth embodiment of the present invention.

In a sixth embodiment shown in FIG. 7, as a concrete constitution of the one-way device 25 in the signal level conversion circuit of the fourth embodiment, a diode D1 is interposed between a source of a first P-channel transistor P1 in a first inverter INV1 and a first power voltage VccA. Therefore, an operation of a first input buffer circuit 23 is similar to that of the third embodiment, and an operation of a level shifter and A to B logic circuit 36 is also similar to that of the signal level conversion circuit according to the fourth embodiment. Other constituting elements that are the same as or correspond to those of the signal level conversion circuit according to the first to fifth embodiments are denoted with the same reference numerals, and redundant description is omitted.

According to the signal level conversion circuit according to the fourth to sixth embodiments, constituting elements in a different circuit are used, that is, a fifth inverter INV5 is used both as two inverters disposed in adjacent positions in a second power voltage VccB system circuit 30, and accordingly areas of the constituting elements occupying the circuit can be saved.

Seventh Embodiment

It is to be noted that in the signal level conversion circuits according to the first to sixth embodiments, whether the first (A to B) logic circuit is disposed alone or also used as the constitution of the level shifter circuit, the first logic circuit has been described as the circuit disposed on the side of the second power voltage VccB system circuit 30, but the present invention is not limited to the constitution. The first logic circuit may also be disposed on the side of the first power voltage system circuit. In the above-described circuit constitutions, only the first input buffer circuit 23 is disposed as the constituting element of the first power voltage VccA system circuit 21, but seventh to ninth embodiments also include an internal circuit as a constituting element. The internal circuit is concretely a first (A to B) logic circuit.

Figure 8:
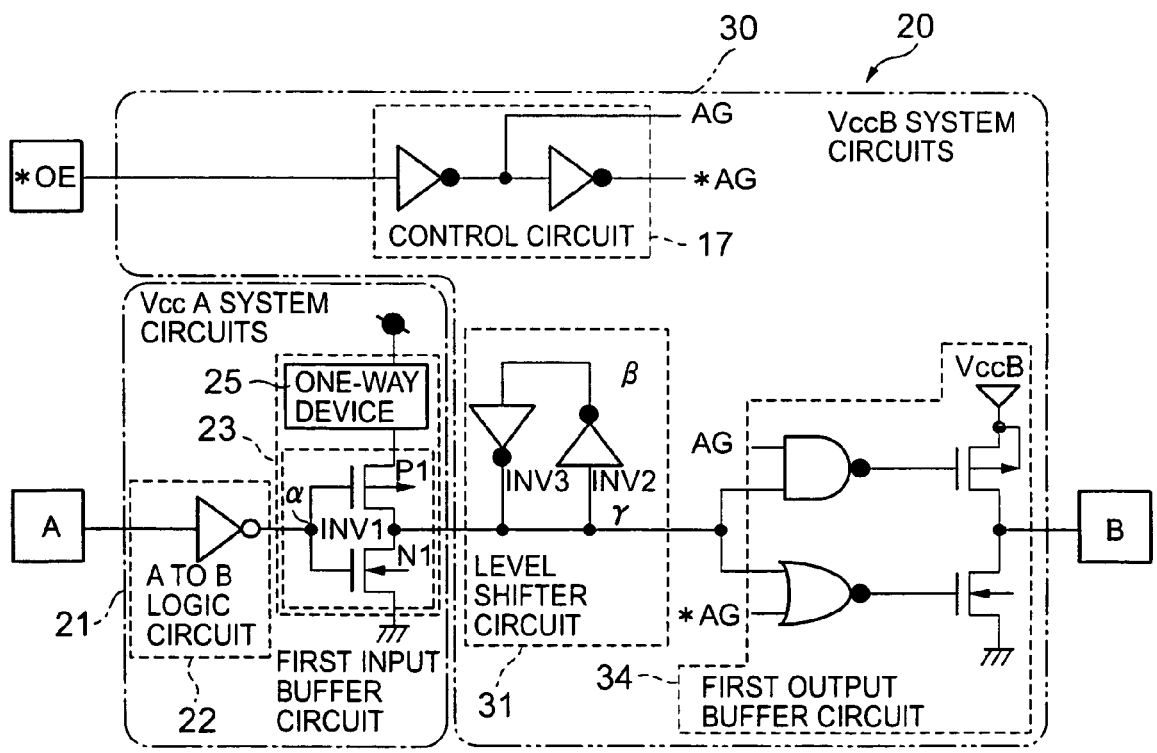
FIG. 8 is a circuit block diagram showing a constitution of the signal level conversion circuit according to a seventh embodiment of the present invention.

As shown in FIG. 8, a signal level conversion circuit 20 according to the seventh embodiment is constituted of a first power voltage VccA system circuit 21 and a second power voltage VccB system circuit 30. The first power voltage VccA system circuit 21 is constituted of: a first (A to B) logic circuit 22 which operates by a first power voltage VccA; a first input buffer circuit 23 constituted of a first inverter INV1 including a first P-channel transistor P1 and a first N-channel transistor N1; and a one-way device 25 interposed between a source of the first P-channel transistor P1 and an input terminal of the first power voltage VccA.

Even by the signal level conversion circuit 20 according to the seventh embodiment, an operation for processing a signal which changes at a level between nodes α and β as described with reference to FIG. 2 can be similarly applied. Therefore, a signal whose level has been shifted to a second power voltage VccB level is supplied to a node γ for inputting the signal to a first output buffer circuit 34. Since the one-way device 25 is disposed, a circuit threshold value between a second inverter INV2 and the first output buffer circuit 34 is also controlled in an operable state. Therefore, the present invention can be carried out even by the constitution of the seventh embodiment in which the first logic circuit 22 is disposed in a stage before the first input buffer circuit 23.

Eighth Embodiment

Figure 9:
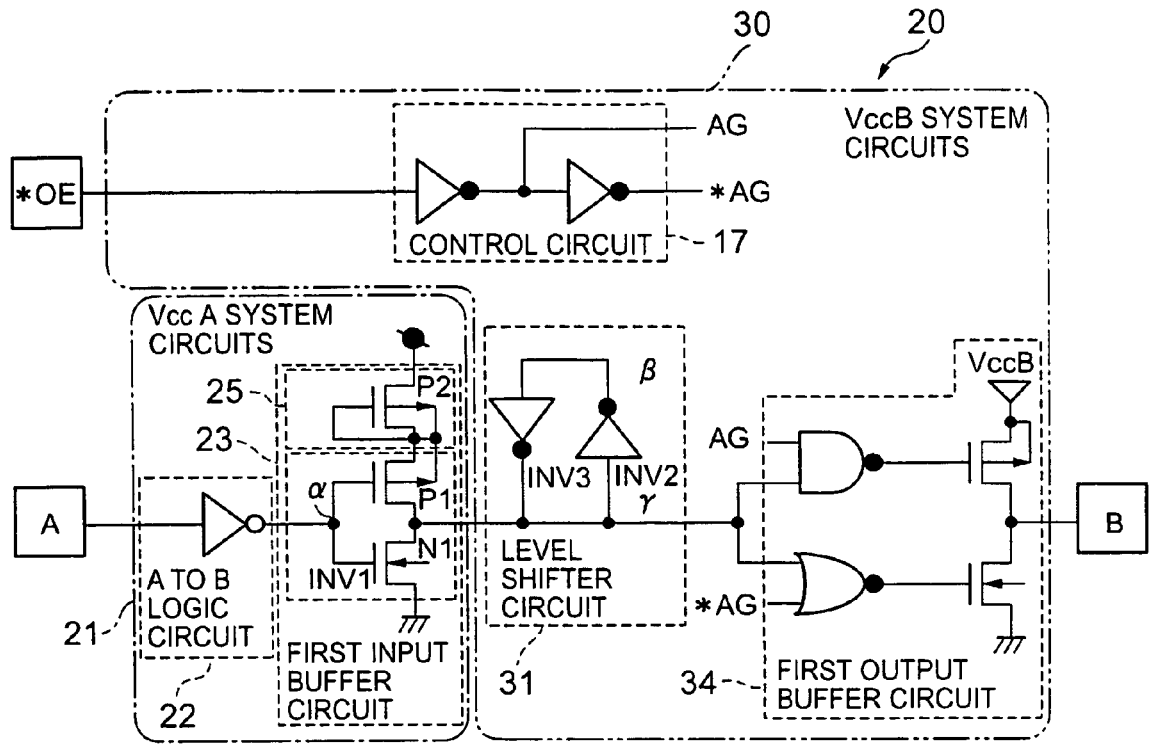
FIG. 9 is a circuit block diagram showing a constitution of the signal level conversion circuit according to an eighth embodiment of the present invention.

As shown in FIG. 9, in a signal level conversion circuit 20 according to an eighth embodiment, the one-way device 25 of the VccA system circuit 21 in the seventh embodiment is constituted of a diode-connected second P-channel transistor P2, and the constitution is similar to that of the one-way device 25 in the second embodiment shown in FIG. 3 or in the fifth embodiment shown in FIG. 6. In the same manner as in the seventh embodiment, a first (A to B) logic circuit 22 is disposed before a first input buffer circuit 23 and between the terminal A and the first input buffer circuit. A signal processing operation at a time when a signal of a first power potential VccA is input is similar to that of the above-described embodiments, and therefore redundant description is omitted.

Ninth Embodiment

Figure 10:
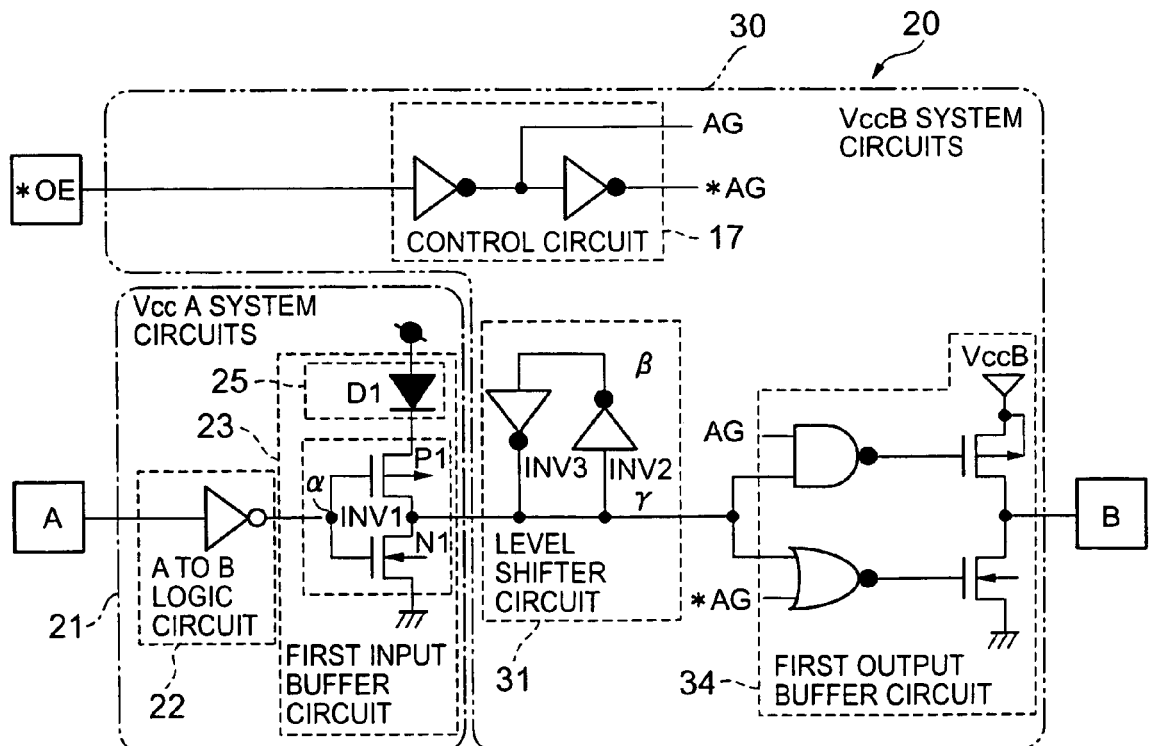
FIG. 10 is a circuit block diagram showing a constitution of the signal level conversion circuit according to a ninth embodiment of the present invention.

As shown in FIG. 10, in a signal level conversion circuit 20 according to a ninth embodiment, the one-way device 25 of the VccA system circuit 21 in the seventh embodiment is constituted of a diode D1 connected between a source of a first P-channel transistor P1 and a terminal of a first power voltage VccA, and the constitution of the one-way device 25 is similar to that of the third embodiment shown in FIG. 4 or the sixth embodiment shown in FIG. 7. A first (A to B) logic circuit 22 is disposed before a first input buffer circuit 23 and between the circuit and a terminal A in the same manner as in the seventh and eighth embodiments. A signal processing operation at a time when a signal of the first power potential VccA is input is similar to that in the above-described embodiments, and therefore redundant description is omitted.

Tenth Embodiment

Any of the above-described signal level conversion circuits according to the first to ninth embodiments have been described as the circuit in which the control circuit 17 for producing the control signal from the operation signal input from the terminal *OE is disposed on the side of the second power voltage VccB system circuit 30. The present invention is not limited to this, the control circuit may also be disposed on the side of the first power voltage VccA system circuit 21, and an example of this circuit is shown by a signal level conversion circuit 20 according to a tenth embodiment shown in FIG. 11.

Figure 11:
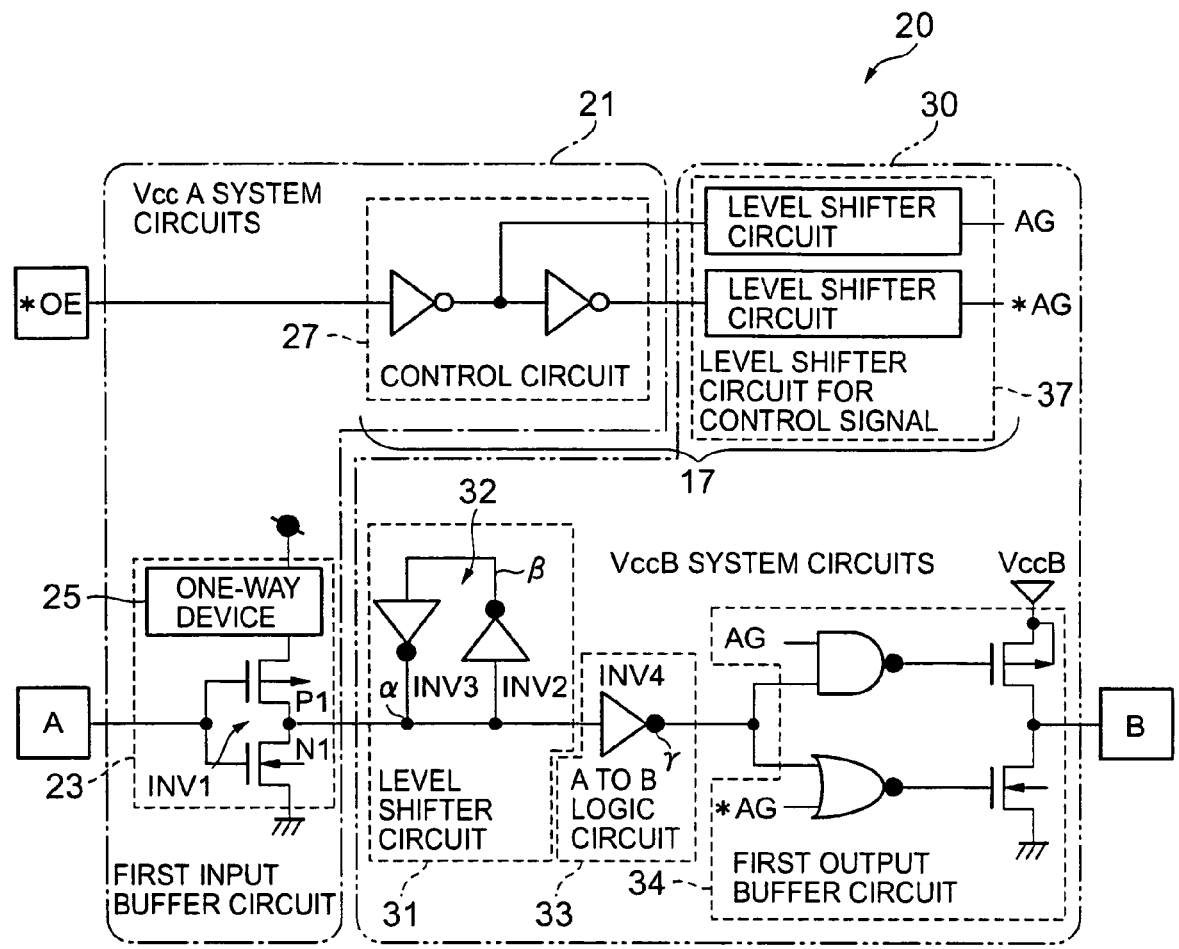
FIG. 11 is a circuit block diagram showing a constitution of the signal level conversion circuit according to a tenth embodiment of the present invention.

As shown in FIG. 11, the signal level conversion circuit 20 according to the tenth embodiment includes control signal production means 17 constituted of: a control circuit 27 disposed in the first power voltage VccA system circuit 21; and a control signal level shifter circuit 37, which shifts a level of a signal potential in order to use the control signal of a first power voltage VccA level output from the control circuit 27 as that of a first output buffer circuit 34 of the second power voltage VccB system circuit 30. The level shifter circuit 37 for the control signal includes a first level shifter circuit which shifts a level of a signal obtained by reversing the potential of the operation signal *OE to a second power voltage VccB level from the first power voltage VccA level, and a second level shifter circuit which reverses the potential of the signal supplied to the first level shifter circuit again.

The constitutions of a first input buffer circuit 23, level shifter circuit 31, first (A to B) logic circuit 33, and first output buffer circuit 34 constituting a first A to B signal path interposed between an input terminal A and an output terminal B of the signal are similar to those of the first embodiment shown in FIG. 1. Since operations of these circuits are also similar to those of the signal level conversion circuit 20 according to the first embodiment, redundant description is omitted.

The constitution of a signal processing path between the terminals A, B in the signal level conversion circuit according to the tenth embodiment is similar to that of the first embodiment shown in FIG. 1, and only the constitution of the control signal production means 17 is different from that of the first embodiment. Similarly, the constitution of the control signal production means 17 shown in FIG. 11 may also be applied to the signal level conversion circuits according to the second to ninth embodiments. In other words, corresponding constitutions may also be provided by combinations of the constitution of the signal processing path between the terminals A, B in the second to ninth embodiments with the constitutions of the control circuit 27 of the VccA system circuit 21 and the level shifter circuit 37 for the control signal of the VccB system circuit 30.

Eleventh Embodiment

Any of the signal level conversion circuits 20 according to the above-described first to tenth embodiments includes only a one-way signal processing path in the A to B direction using the terminal A as the input terminal of VccA and the terminal B as the output terminal of VccB (VccA<VccB). The present invention is not limited to this constitution, and may also be applied to a signal level conversion circuit 40. In the circuit, voltage sources for supplying a predetermined reference voltage, a first power voltage VccA higher than the reference voltage, and a second power voltage VccB higher than the first power voltage VccA are disposed. Between a first terminal A for a signal input/output of the first power voltage VccA and a second terminal B for a signal input/output of the second power voltage VccB, a bidirectional signal processing path 43 is formed. The path is constituted of a first direction signal processing path 41 in which the first terminal A is an input terminal and the second terminal B is an output terminal, and a second direction signal processing path 42 in which the second terminal B is an input terminal and the first terminal A is an output terminal. As concrete examples in which the bidirectional signal processing path 43 is formed, eleventh to twentieth embodiments will be described hereinafter.

Figure 12:
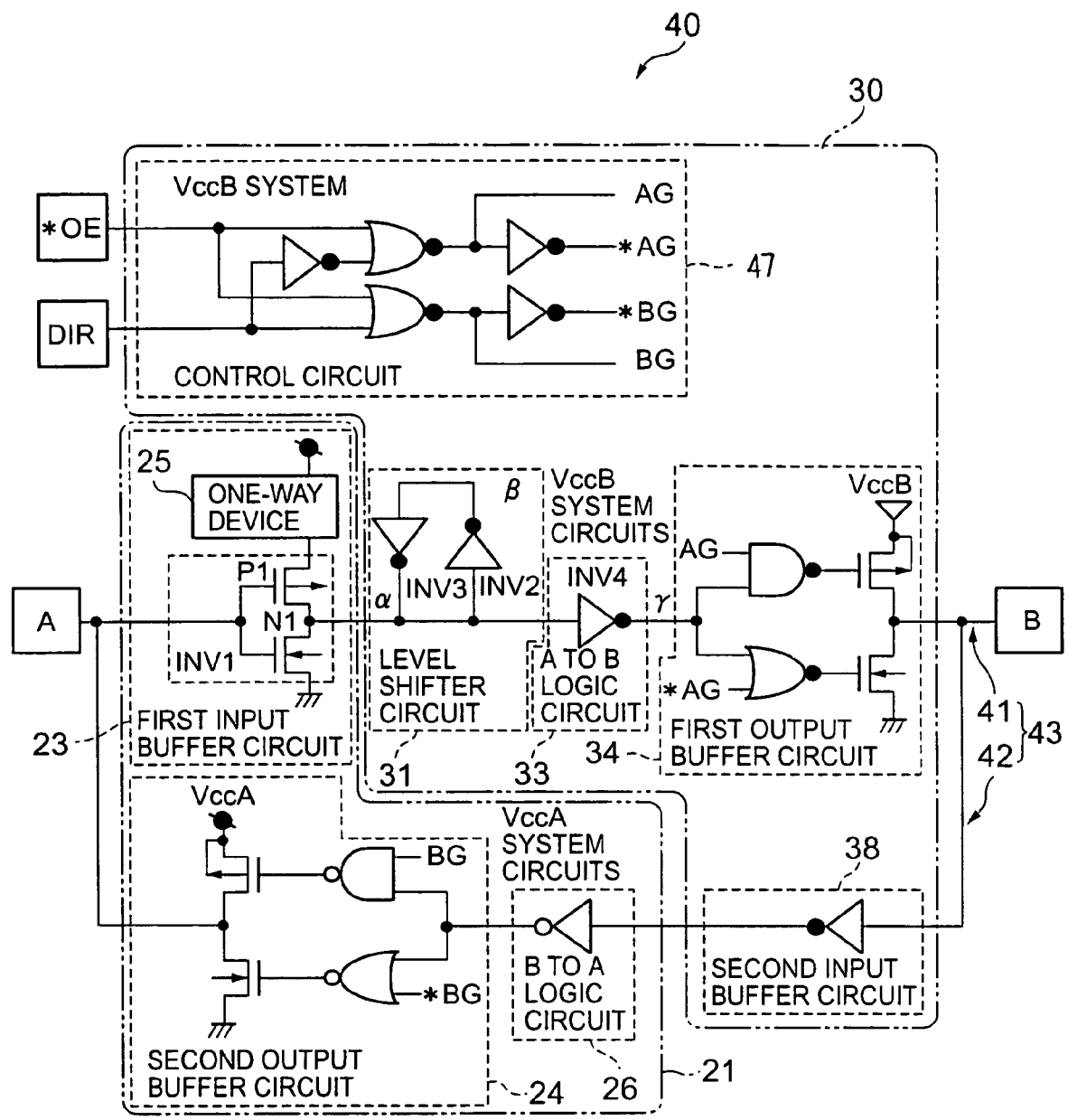
FIG. 12 is a circuit block diagram showing a constitution of the signal level conversion circuit according to an eleventh embodiment of the present invention which is a basic constitution including a bidirectional signal path.

In the signal level conversion circuit 40 according to the eleventh embodiment shown in FIG. 12, bidirectional signal processing of the bidirectional signal processing path 43 is controlled by a control circuit 47 which produces first direction control signals AG, *AG and second direction control signals BG, *BG based on an activating signal input from a control terminal *OE and a processing direction indicating signal input from a direction indicating terminal DIR, respectively. The first direction signal processing path 41 includes: a first input buffer circuit 23 including a first inverter INV1 constituted of a first P-channel transistor P1 and a first N-channel transistor N1 whose gates are connected to the first terminal A and a one-way device 25 interposed between a source of the first P-channel transistor P1 of the first inverter INV1 and the first power voltage VccA; a first output buffer circuit 34 which outputs a signal of the second power voltage VccB via the second terminal B as the output terminal; a level shifter circuit 31 interposed between an output of the first input buffer circuit 23 and the second terminal B and including a series inverter circuit constituted of second and third inverters INV2, INV3 using the second power voltage VccB; and a first logic circuit 33 disposed in a certain position between the first terminal A and a first output buffer circuit 34 in the first direction signal processing path 41.

The second direction signal processing path 42 includes: a second input buffer circuit 38 into which the signal of the second power voltage VccB is input via the second terminal B as the input terminal; a second output buffer circuit 24 which outputs the signal of the second power voltage VccB via the first terminal A as the output terminal; and a second (B to A) logic circuit 26 disposed in a certain portion between the second terminal B which is the input terminal in the second direction signal processing path 42 and the second output buffer circuit 24.

In the first direction signal processing path 41, a circuit threshold value of the second inverter INV2 of the series inverter circuit 32 in which the second power voltage VccB is used is set to be lower than a voltage obtained by subtracting a voltage drop consumed by the one-way device 25 from the first power voltage VccA. A circuit threshold value of the first (A to B) logic circuit 33 is set to be lower than a voltage obtained by subtracting a voltage drop consumed by the one-way device 25 of the first input buffer circuit 23 from the first power voltage VccA.

In the signal level conversion circuit 40 according to the eleventh embodiment, the constitution between the first and second terminals A, B in the signal level conversion circuit 20 of the first embodiment is a basic constitution. Moreover, the second direction signal processing path 42 is disposed in which the second terminal B is an input terminal and the first terminal A. Additionally, in the constitution of the control circuit 47, the control signals AG, *AG for controlling the first direction and the control signals BG, *BG for controlling the second direction are produced using the signal from the terminal DIR into which a processing direction switching signal, and supplied to the first output buffer circuit 34 and the second output buffer circuit 24.

In the present invention, the first direction signal processing path 41 is a necessary and sufficient constituting element in which the signal of the first power voltage VccA higher than the predetermined reference voltage is processed, and the signal level is further converted to the second power voltage VccB higher than the first power voltage VccA. The second direction signal processing path 42 for converting the signal level to the first power voltage VccA from the second power voltage VccB may not be disposed basically. Therefore, the basic constitution is the one-way signal level conversion circuit as in the first embodiment described with reference to FIGS. 1 and 2, but the signal level conversion circuit 20 of the first embodiment may also be basically used to constitute the signal level conversion circuit 40 of the eleventh embodiment shown in FIG. 12. The signal level conversion circuit 40 according to the eleventh embodiment includes the same basic constitution as that of the signal level conversion circuit 20 according to the first embodiment, and therefore produces a function/effect similar to that of the first embodiment.

Twelfth Embodiment

The signal level conversion circuits according to the twelfth to twentieth embodiments correspond to those of the second to tenth embodiments, and therefore the constitutions of the embodiments including the bidirectional signal processing path will be described hereinafter in detail with reference to FIGS. 13 to 21. It is to be noted that the constituting elements which are the same as or correspond to those of the constitutions according to the first to eleventh embodiments are denoted with the same reference numerals, and redundant description is omitted.

Figure 13:
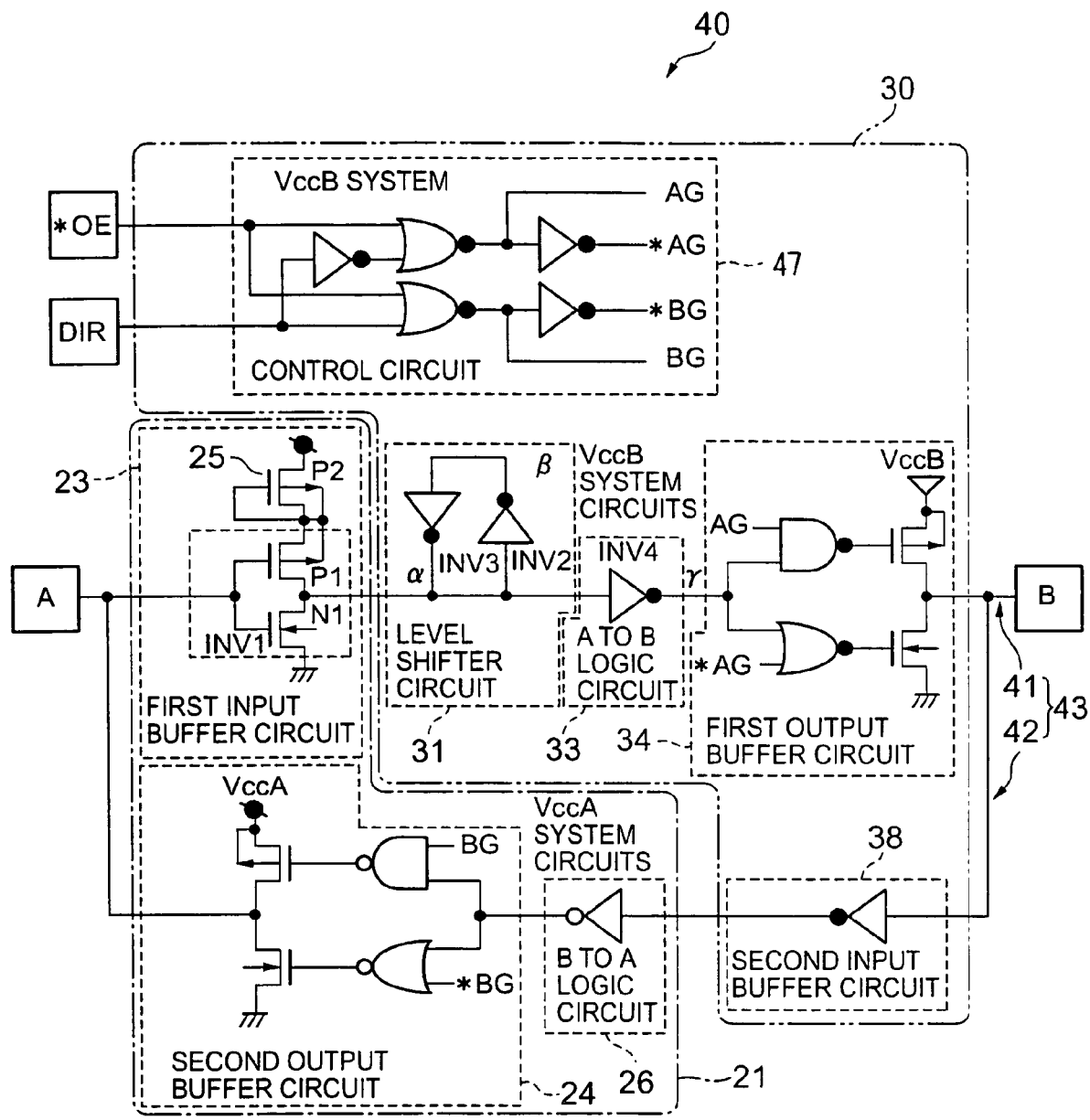
FIG. 13 is a circuit block diagram showing a constitution of a bidirectional signal level conversion circuit according to a twelfth embodiment of the present invention.

As shown in FIG. 13, in the signal level conversion circuit 40 according to the twelfth embodiment, the one-way device 25 interposed between the source of the first P-channel transistor P1 constituting the first inverter INV1 of the first input buffer circuit 23 and the power supply of the first power voltage VccA is constituted of a second P-channel transistor P2 diode-connected between the source of the transistor P1 and the VccA power supply in the same manner as in the signal level conversion circuit 20 of the second embodiment shown in FIG. 3. Since other constitutions are the same as those of the signal level conversion circuit 40 according to the eleventh embodiment shown in FIG. 12, the same constituting elements are denoted with the same reference numerals, and redundant description is omitted.

Thirteenth Embodiment

Figure 14:
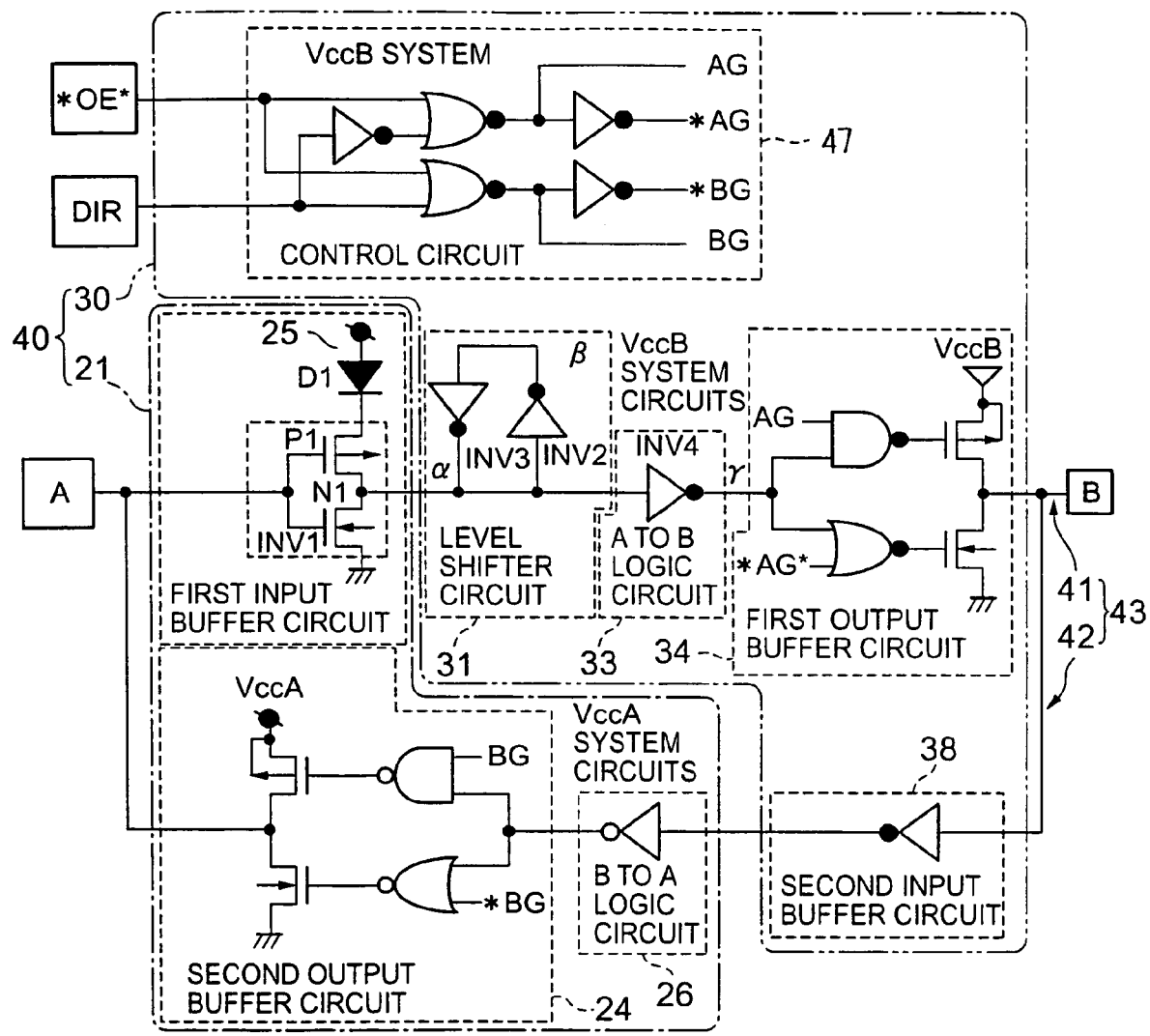
FIG. 14 is a circuit block diagram showing a constitution of the bidirectional signal level conversion circuit according to a thirteenth embodiment of the present invention.

As shown in FIG. 14, in a signal level conversion circuit 40 according to a thirteenth embodiment, the one-way device 25 interposed between the source of the first P-channel transistor P1 constituting the first inverter INV1 of the first input buffer circuit 23 and the power supply of the first power voltage VccA is constituted of a diode D1 connected between the source of the transistor P1 and the VccA power supply in the same manner as in the signal level conversion circuit 20 of the third embodiment shown in FIG. 4. Since other constitutions are the same as those of the signal level conversion circuit 40 according to the eleventh embodiment shown in FIG. 12, the same constituting elements are denoted with the same reference numerals, and redundant description is omitted.

Fourteenth Embodiment

Figure 15:
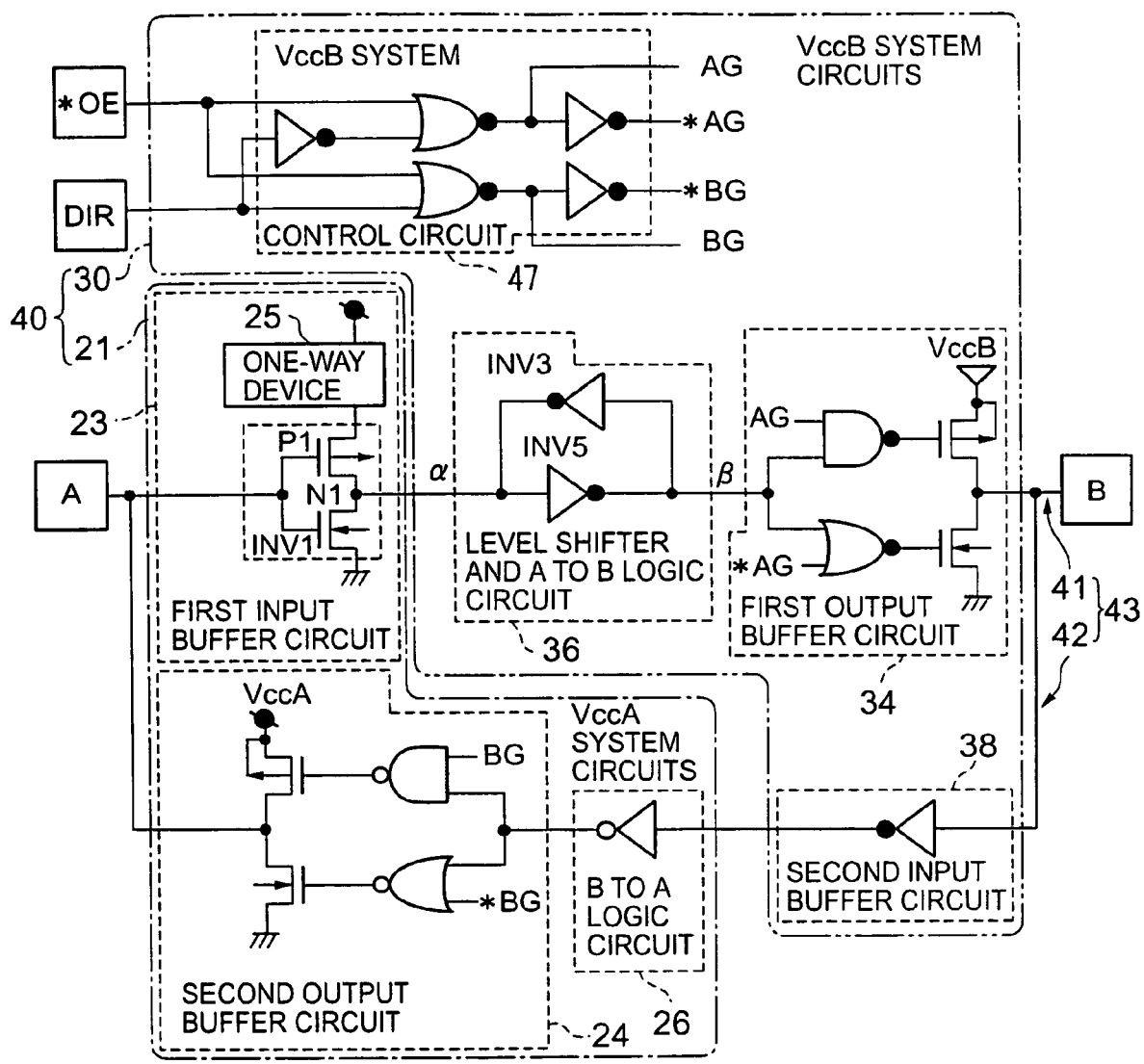
FIG. 15 is a circuit block diagram showing a constitution of the bidirectional signal level conversion circuit according to a fourteenth embodiment of the present invention.

As shown in FIG. 15, in a signal level conversion circuit 40 according to a fourteenth embodiment, the fourth inverter INV4 constituting the first logic circuit 33 in FIG. 12 is constituted to serve also as the second inverter INV2 of the level shifter circuit 31 in the same manner as in the signal level conversion circuit 20 of the fourth embodiment shown in FIG. 5. Examples of this constitution include signal level conversion circuits 40 according to fourteenth to sixteenth embodiments.

As shown in FIG. 15, the signal level conversion circuit 20 according to the fourteenth embodiment includes a VccA system circuit 21 and a VccB system circuit 30, and further includes a bidirectional signal processing circuit 43 constituted of a first direction signal processing path 41 and a second direction signal processing path 42. A fifth inverter INV5 connected in series in a forward direction is interposed between nodes α and β in the first direction signal processing path 41 of the VccB system circuit 30. The fifth inverter INV5 and a third inverter INV3 connected in parallel and in reverse from the node β to α constitute a level shifter and A to B logic circuit 36. As described above, the fifth inverter INV5 is used both as the second inverter INV2 of the level shifter circuit 31 and the fourth inverter INV4 of the first (A to B) logic circuit 33 in the first to third embodiments. By this constitution, a circuit scale can further be simplified, a chip size can be reduced, and a signal processing rate can be increased.

Fifteenth Embodiment

Figure 16:
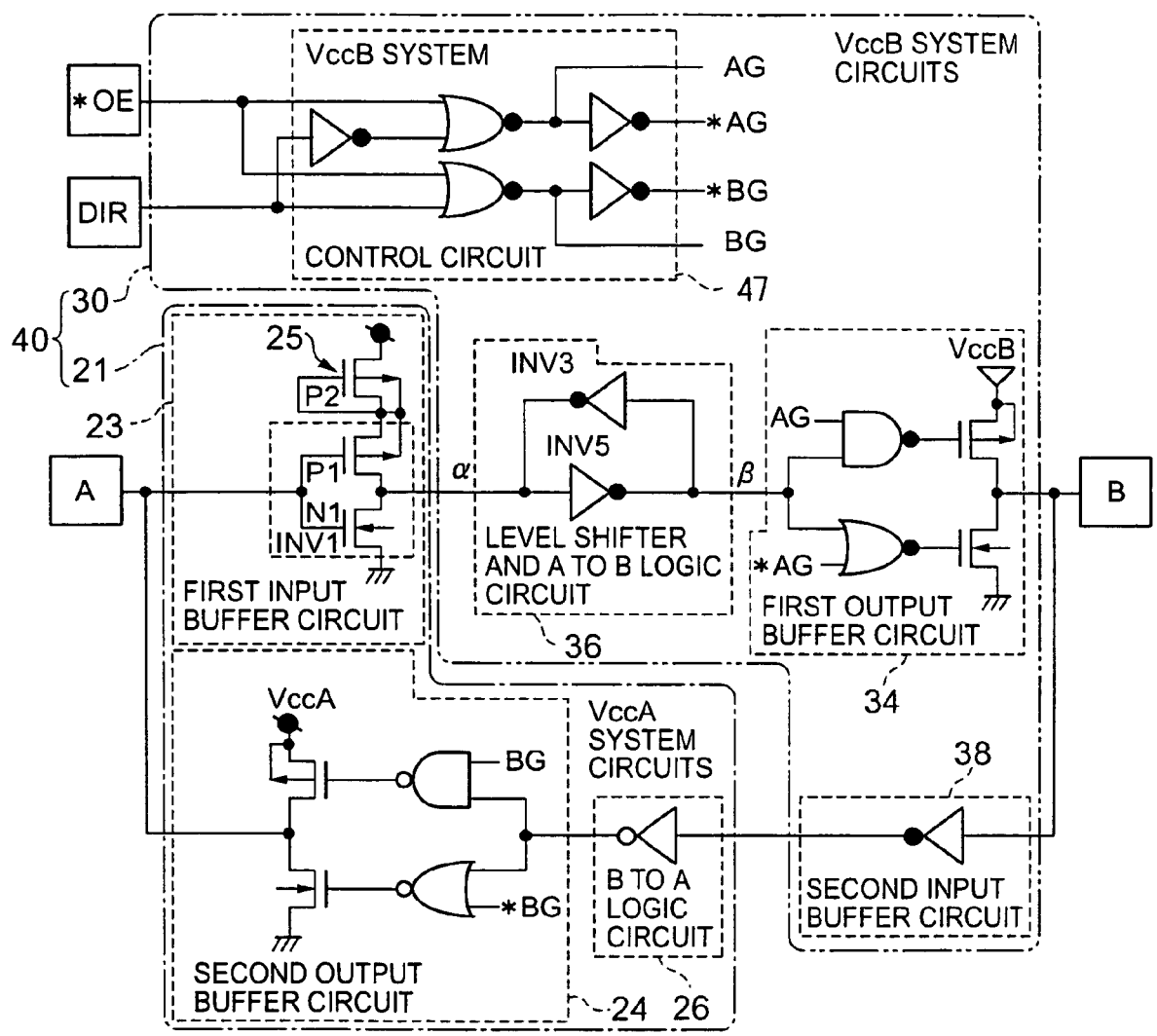
FIG. 16 is a circuit block diagram showing a constitution of the bidirectional signal level conversion circuit according to a fifteenth embodiment of the present invention.

As shown in FIG. 16, in a signal level conversion circuit 40 according to a fifteenth embodiment, the one-way device 25 interposed between the source of the first P-channel transistor P1 constituting the first inverter INV1 of the first input buffer circuit 23 and the power supply of the first power voltage VccA is constituted of a second P-channel transistor P2 diode-connected between the source of the transistor P1 and the VccA power supply in the same manner as in the signal level conversion circuit 20 of the fifth embodiment shown in FIG. 6. Since other constitutions are similar to those of the signal level conversion circuit 40 according to the fourteenth embodiment shown in FIG. 15, the same constituting elements are denoted with the same reference numerals, and redundant description is omitted.

Sixteenth Embodiment

Figure 17:
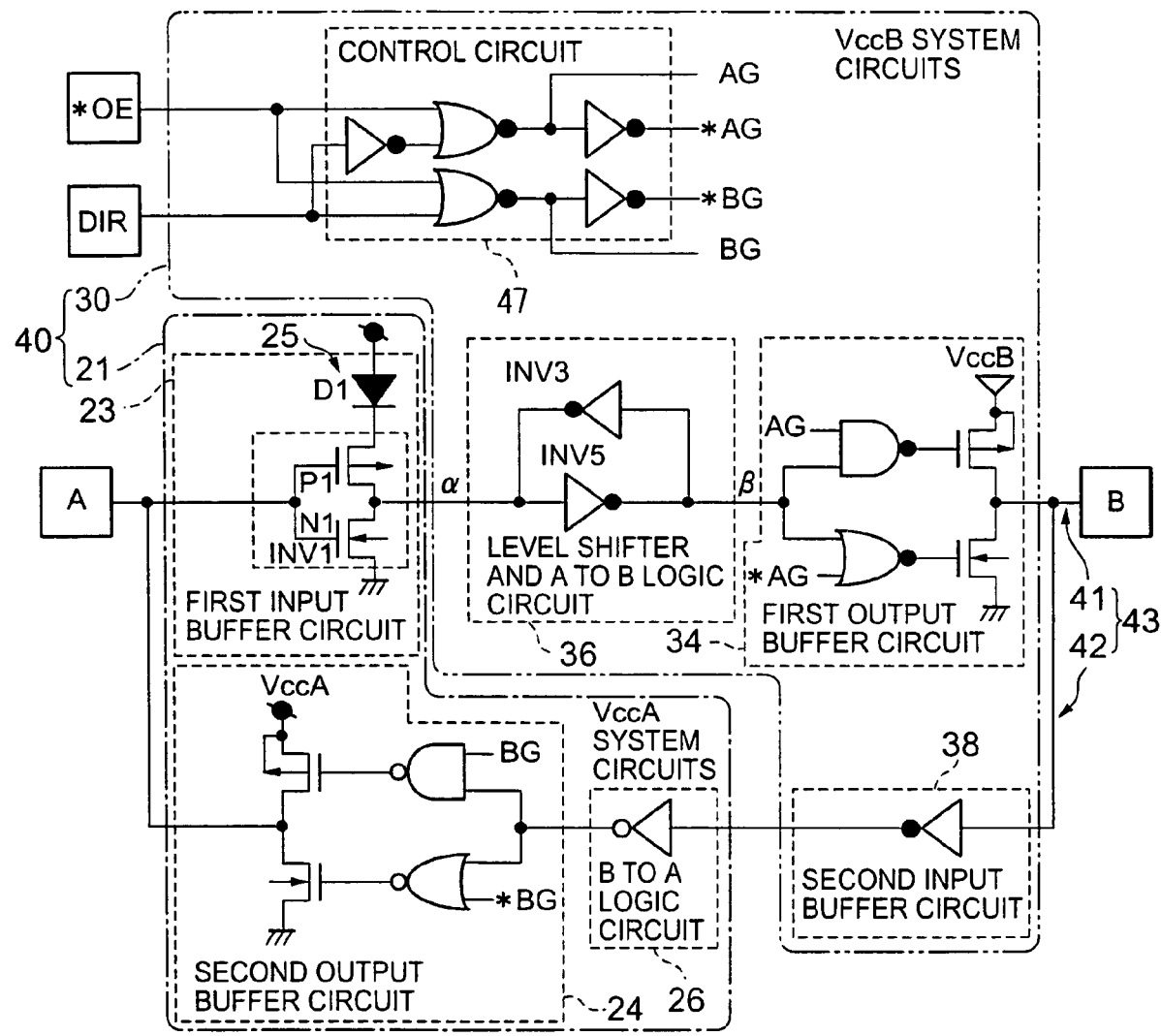
FIG. 17 is a circuit block diagram showing a constitution of the bidirectional signal level conversion circuit according to a sixteenth embodiment of the present invention.

As shown in FIG. 17, in a signal level conversion circuit 40 according to a sixteenth embodiment, the one-way device 25 interposed between the source of the first P-channel transistor P1 constituting the first inverter INV1 of the first input buffer circuit 23 and the power supply of the first power voltage VccA is constituted of a diode D1 connected between the source of the transistor P1 and the VccA power supply in the same manner as in the signal level conversion circuit 20 of the sixth embodiment shown in FIG. 7. Since other constitutions are similar to those of the signal level conversion circuit 40 according to the eleventh embodiment shown in FIG. 12, the same constituting elements are denoted with the same reference numerals, and redundant description is omitted.

Seventeenth Embodiment

It is to be noted that in the signal level conversion circuits according to the above-described eleventh to sixteenth embodiments, whether the first (A to B) logic circuit is disposed alone or also used as the constitution of the level shifter circuit, the first logic circuit has been described as the circuit disposed on the side of the second power voltage VccB system circuit 30, but the present invention is not limited to the constitution even in the bidirectional signal processing circuit. The first logic circuit may also be disposed on the side of the first power voltage system circuit. In the above-described circuit constitutions, only the first input buffer circuit 23 is disposed as the constituting element of the first power voltage VccA system circuit 21, but seventeenth to nineteenth embodiments also include a first logic circuit which is an internal circuit as a constituting element of the VccA system circuit 21. The internal circuit is concretely a first (A to B) logic circuit 22.

Figure 18:
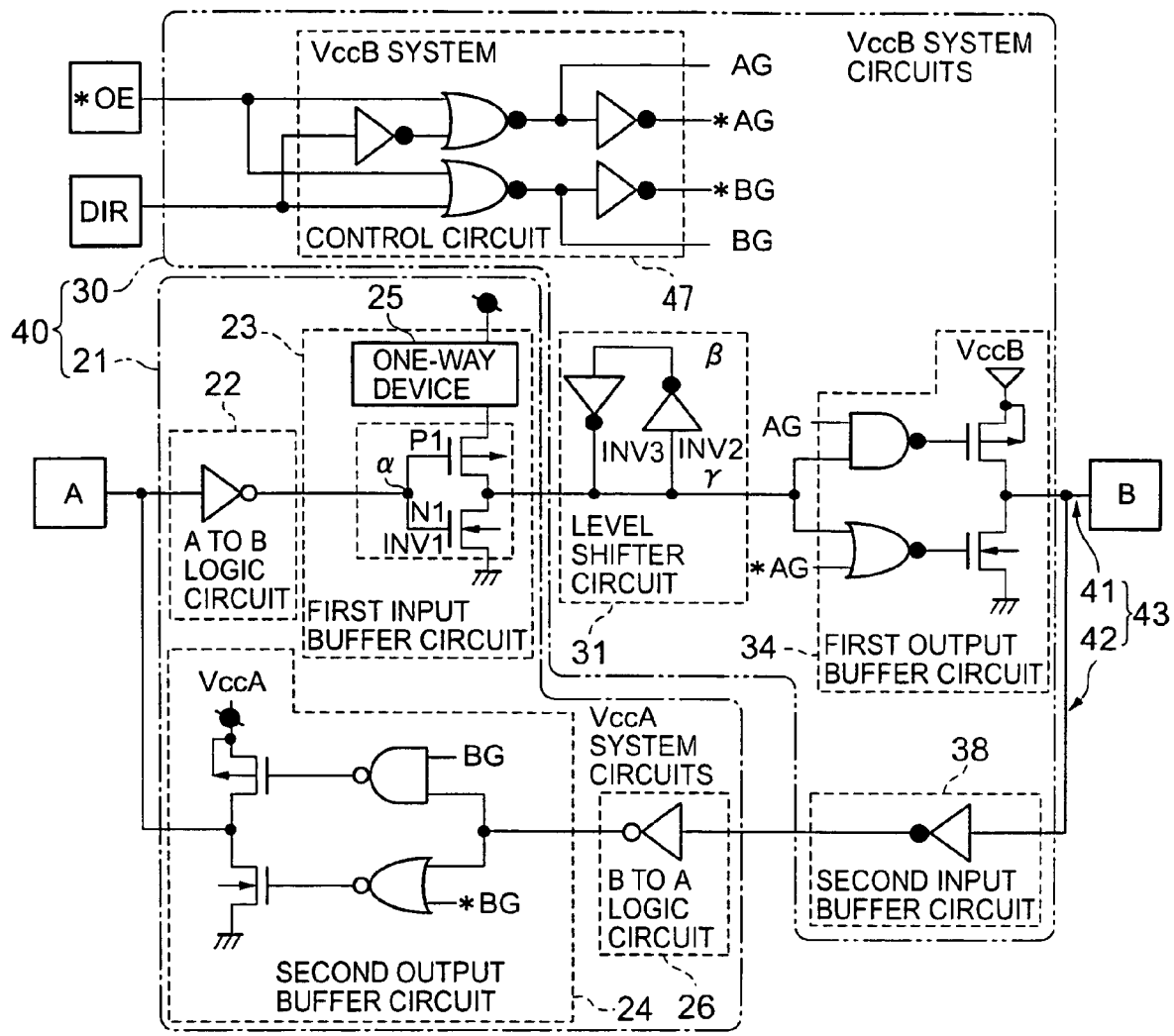
FIG. 18 is a circuit block diagram showing a constitution of the bidirectional signal level conversion circuit according to a seventeenth embodiment of the present invention.

As shown in FIG. 18, a signal level conversion circuit 40 according to the seventeenth embodiment is constituted of a first power voltage VccA system circuit 21 and a second power voltage VccB system circuit 30. The first power voltage VccA system circuit 21 is constituted of: a first (A to B) logic circuit 22 which operates by a first power voltage VccA; and a first input buffer circuit 23 constituted of a first inverter INV1 including a first P-channel transistor P1 and a first N-channel transistor N1. The first input buffer circuit 23 includes a one-way device 25 interposed between a source of the first P-channel transistor P1 and an input terminal of the first power voltage VccA.

Even by the signal level conversion circuit 40 according to the seventeenth embodiment, an operation for processing a signal which changes at a level between nodes α and β as described with reference to FIG. 2 can be similarly applied. Therefore, a signal whose level has been shifted to a second power voltage VccB level is supplied to a node γ for inputting the signal to a first output buffer circuit 34. Since the one-way device 25 is disposed, a circuit threshold value between a second inverter INV2 and the first output buffer circuit 34 is also controlled in an operable state. Therefore, the present invention can be carried out even by the constitution of the seventeenth embodiment in which the first logic circuit 22 is disposed in a stage before the first input buffer circuit 23.

Eighteenth Embodiment

Figure 19:
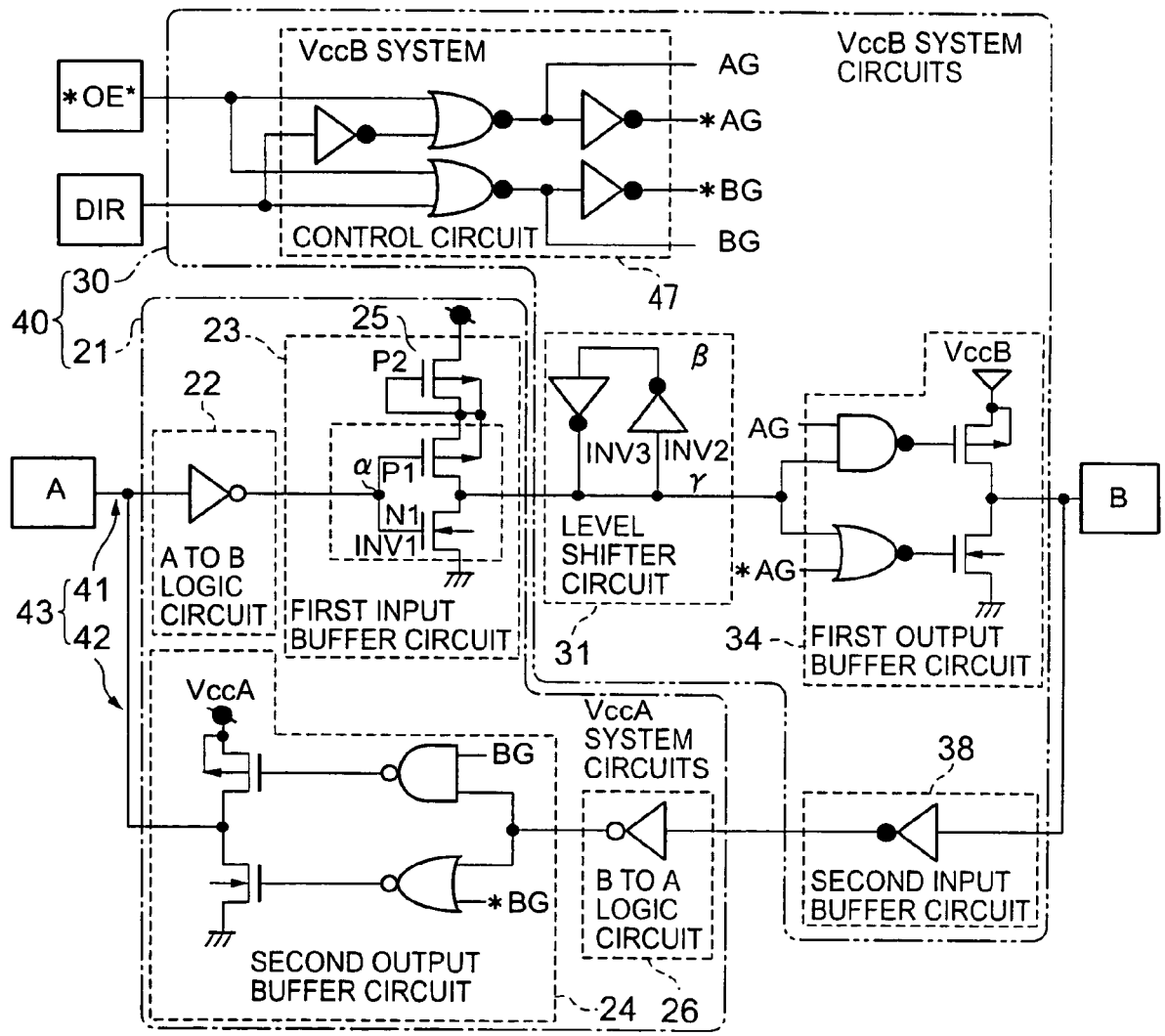
FIG. 19 is a circuit block diagram showing a constitution of the bidirectional signal level conversion circuit according to an eighteenth embodiment of the present invention.

As shown in FIG. 19, in a signal level conversion circuit 40 according to an eighteenth embodiment, the one-way device 25 disposed in the first input buffer circuit 23 of the seventeenth embodiment shown in FIG. 18 is concretely constituted. In FIG. 19, the one-way device 25 disposed in the first input buffer circuit 23 includes a second P-channel transistor P2 diode-connected as the one-way device 25 between a source of a first P-channel transistor P1 and a power supply terminal of a first power voltage VccA. Other constitutions are similar to those of the signal level conversion circuit 40 according to the seventeenth embodiment shown in FIG. 18, and denoted with the same reference numerals, and redundant description is accordingly omitted.

Nineteenth Embodiment

Figure 20:
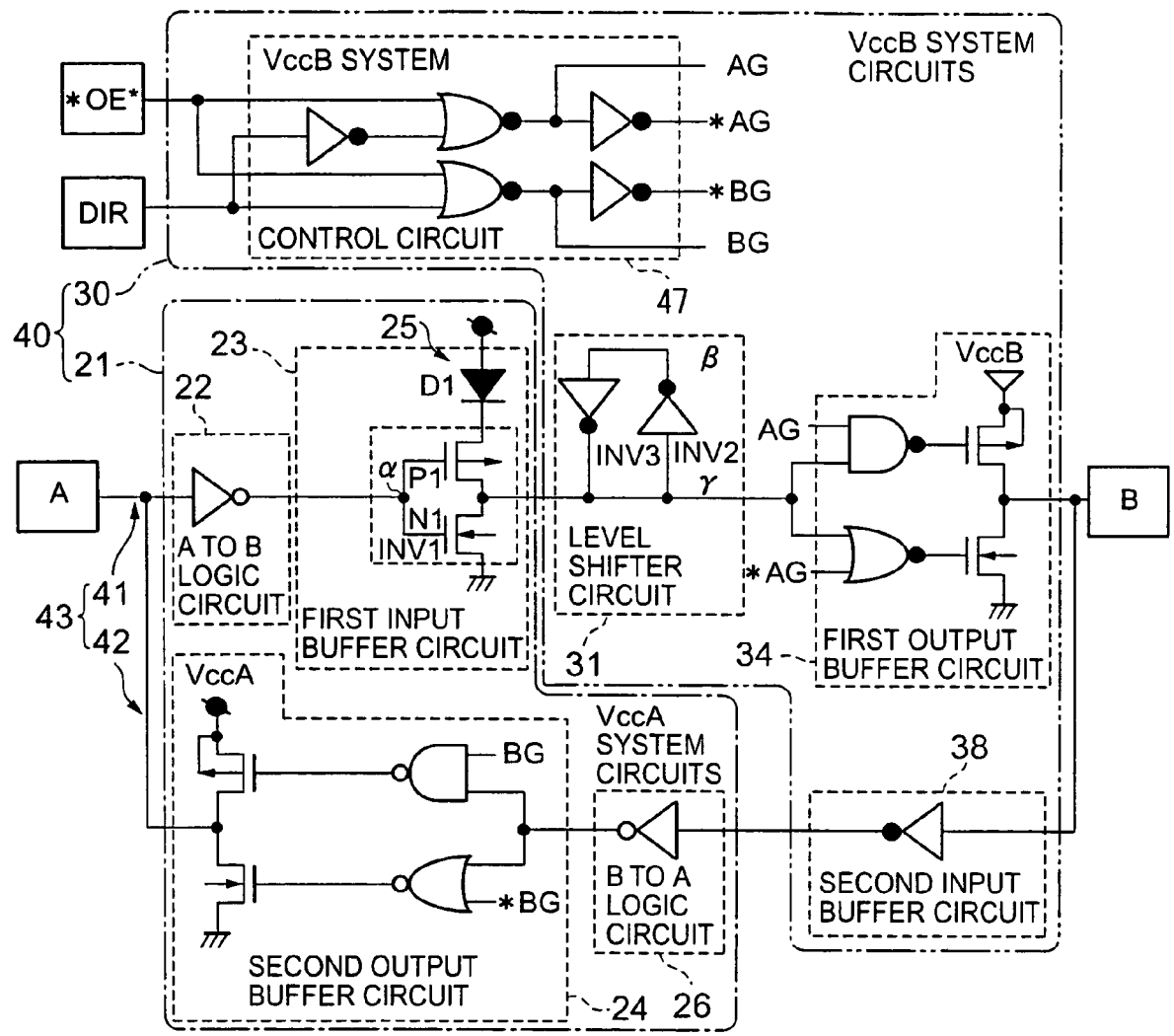
FIG. 20 is a circuit block diagram showing a constitution of the bidirectional signal level conversion circuit according to a nineteenth embodiment of the present invention.
Figure 21:
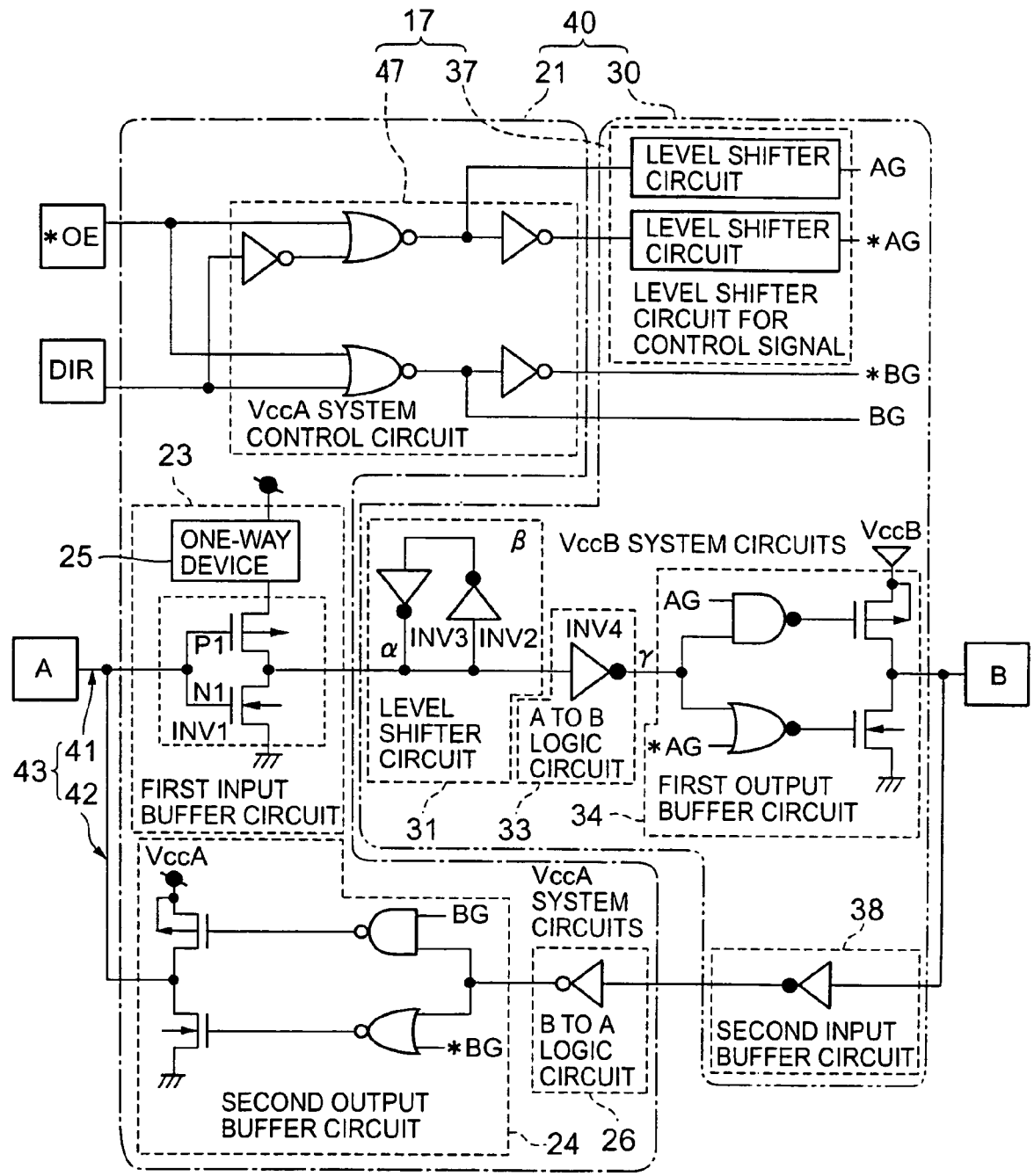
FIG. 21 is a circuit block diagram showing a constitution of the bidirectional signal level conversion circuit according to a twentieth embodiment of the present invention.
Figure 22:
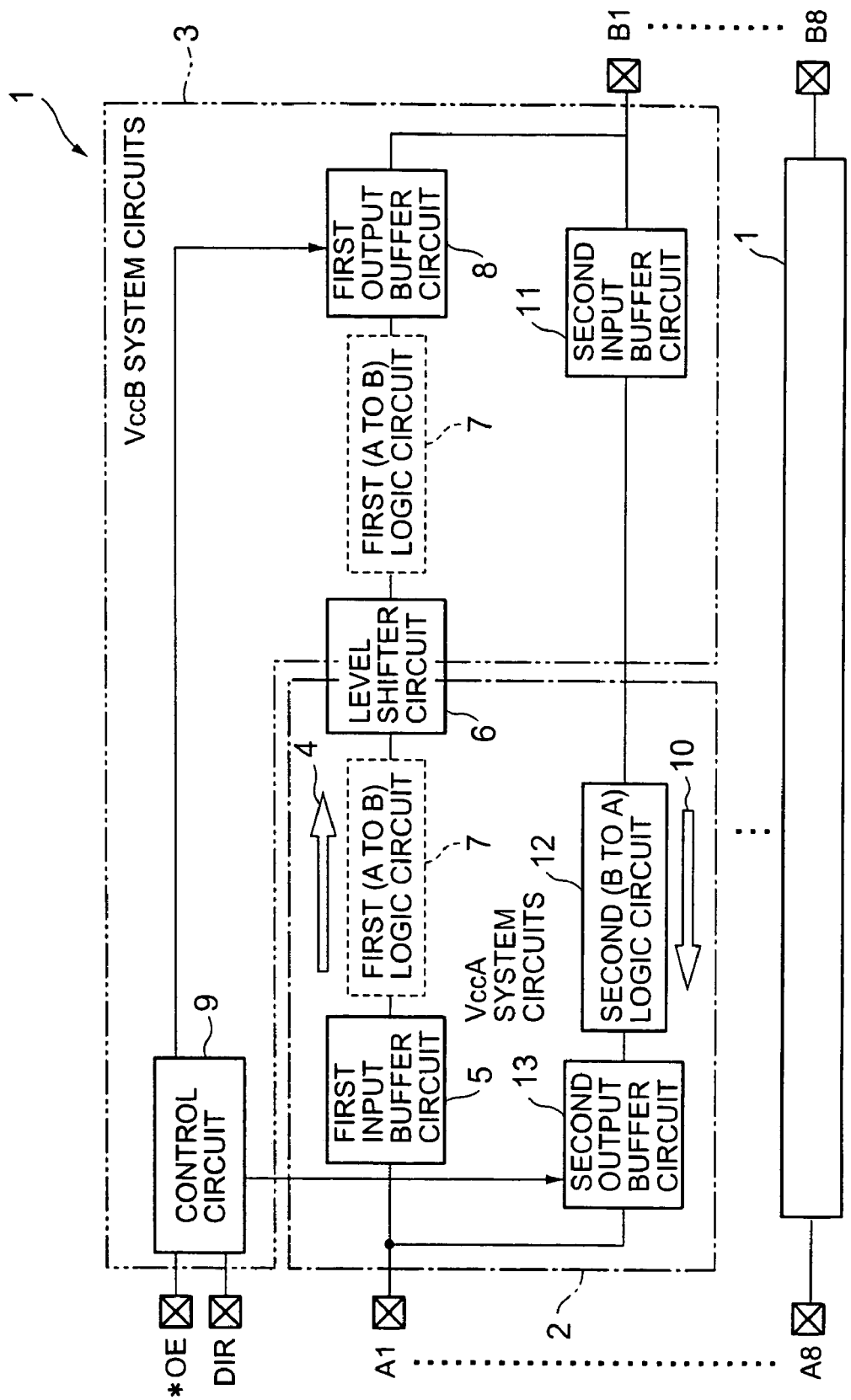
FIG. 22 is a block diagram showing a whole constitution of the signal level conversion circuit including a bidirectional signal path according to the embodiment of the present invention.

As shown in FIG. 20, in a signal level conversion circuit 40 according to a nineteenth embodiment, the one-way device 25 disposed in the first input buffer circuit 23 of the seventeenth embodiment shown in FIG. 18 is concretely constituted unlike the constitution of FIG. 19. In FIG. 20, the one-way device 25 disposed in the first input buffer circuit 23 includes a diode D1 connected as the one-way device 25 between a source of a first P-channel transistor P1 and a power supply terminal of a first power voltage VccA in the same manner as in the ninth embodiment of FIG. 10. Other constitutions are similar to those of the signal level conversion circuits 40 according to the seventeenth and eighteenth embodiments shown in FIGS. 18, 19 and denoted with the same reference numerals, and redundant description is accordingly omitted.

Twentieth Embodiment

It is to be noted that the present invention is not limited to the above-described embodiments, and can be variously modified. For example, in any of the signal level conversion circuits 40 including the bidirectional signal processing paths 43 according to the above-described eleventh to nineteenth embodiments, the control circuit 47 is disposed on the side of the VccB system circuit 30, but the present invention is not limited to this constitution. The constitution may include control signal production means 17 constituted of a control circuit 47 disposed on the side of a first power voltage VccA system circuit 21 and a control signal level shifter circuit 37 disposed on the side of a second power voltage VccB system circuit 30 in the same manner as in the signal level conversion circuit 20 according to the tenth embodiment including the one-way signal processing path shown in FIG. 11. The level shifter circuit 37 for the control signals includes: a first level shifter circuit which shifts a level of a NOR output of an operation signal input from a terminal *OE and an operation signal obtained by reversing a potential of a direction indicating signal input from a terminal DIR to a second power voltage VccB level from the first power voltage VccA level; and a second level shifter circuit which shifts a level of a signal obtained by reversing the potential of the signal supplied to the first level shifter circuit again to VccB from VccA to produce a control signal *AG having a different potential for the first direction.

Other constitutions of the first direction signal processing path 41 and the second direction signal processing path 42 constituting an A to B first signal path interposed between the input terminal A and the output terminal B of the signal are similar to those of the eleventh embodiment shown in FIG. 12. Operations of these circuits are also similar to those of the signal level conversion circuit 40 according to the eleventh embodiment, and therefore redundant description is omitted. The control signals AG, *AG have a second power voltage VccB level, but the direction of a logic operation is a first direction A to B, and therefore the signals are denoted with "AG", "*AG". It is to be noted that the control signals BG, *BG for use in the second output buffer circuit 24 of the first power voltage VccA system circuit 21 are supplied to circuit devices as such without being level-shifted.

In the signal level conversion circuit 40 according to the twentieth embodiment, the constitution of the signal processing path between the terminals A and B is similar to that of the eleventh embodiment shown in FIG. 12, and only the constitution of the control signal production means 17 is different from that of the eleventh embodiment. However, in the same manner as in the eleventh embodiment, the constitution of the control signal production means 17 shown in FIG. 21 may also be applied to the signal level conversion circuits according to the twelfth to the nineteenth embodiments. In other words, the constitution of the signal processing path between the terminals A, B in the twelfth to nineteenth embodiments may also be combined with the constitutions of the control circuit 47 of the VccA system 21 and the level shifter circuit 37 for the control signals of the VccB system circuit 30 shown in FIG. 21 to provide corresponding constitutions.

It is to be noted that the signal level conversion circuit according to the above-described basic constitution of the present invention further includes a first logic circuit disposed in the signal path to logically calculate the signal of the first or second power voltage, and a circuit threshold value of the first logic circuit may also be set to be lower than a voltage obtained by subtracting a voltage drop of the one-way device from the first power voltage.

In the present invention, signal levels of different power voltages can be converted by a simple circuit constitution, a chip size can be reduced by reduction of the number of devices, and a circuit operation can be speeded up by reduction of the number of circuit stages.

What is claimed is:

1. A signal level conversion circuit having voltage sources for supplying a first power voltage higher than a predetermined reference voltage and a second power voltage higher than the first power voltage, respectively, and comprising at least a first terminal for a signal of the first power voltage, a second terminal for a signal of the second power voltage, and a level shifter circuit which is disposed in a signal path between the first terminal and the second terminal to convert the signal of the first power voltage into the signal of the second power voltage, the circuit further comprising:

a first input buffer circuit including a first inverter which is connected to the first terminal and a one-way device which is interposed between the first inverter and the first power voltage and which supplies a current from the first power voltage to the first inverter; and the level shifter circuit including second and third inverters which are interposed between an output of the first input buffer circuit and the second terminal and which use the second power voltage and which are connected in series, an input of the second inverter and an output of the third inverter being connected to the output of the first input buffer circuit, wherein a circuit threshold value of the second inverter is set to be lower than a voltage obtained by subtracting a voltage drop of the one-way device from the first power voltage;

wherein the signal path constitutes a one-way signal processing path in which the first terminal is used as an input terminal and the second terminal is used as an output terminal, and one-way signal processing of the one-way signal processing path is controlled by a control circuit which produces a control signal based on a signal input from a control terminal, and the level shifter circuit is disposed in a stage after at least the first input buffer circuit in the one-way signal processing path;

wherein the level shifter circuit includes a series inverter circuit comprising a serially connected member of the second and third inverters reversely connected in parallel between the first input buffer circuit and the second terminal; and wherein the signal conversion circuit further comprises:

a fourth inverter serially disposed between an input of the second inverter and the second terminal on the one-way signal processing path, wherein a circuit threshold value of the fourth inverter is set to be lower than a voltage obtained by subtracting the voltage drop of the one-way device from the first power voltage.

2. A signal level conversion circuit having voltage sources for supplying a first power voltage higher than a predetermined reference voltage and a second power voltage higher than the first power voltage, respectively, and comprising at least a first terminal for a signal of the first power voltage, a second terminal for a signal of the second power voltage, and a level shifter circuit which is disposed in a signal path between the first terminal and the second terminal to convert the signal of the first power voltage into the signal of the second power voltage, the circuit further comprising:
  a first input buffer circuit including a first inverter which is connected to the first terminal and a one-way device which is interposed between the first inverter and the first power voltage and which supplies a current from the first power voltage to the first inverter; and
  the level shifter circuit including second and third inverters which are interposed between an output of the first input buffer circuit and the second terminal and which use the second power voltage and which are connected in series, an input of the second inverter and an output of the third inverter being connected to the output of the first input buffer circuit,
  wherein a circuit threshold value of the second inverter is set to be lower than a voltage obtained by subtracting a voltage drop of the one-way device from the first power voltage;
  wherein the signal path constitutes a one-way signal processing path in which the first terminal is used as an input terminal and the second terminal is used as an output terminal, and one-way signal processing of the one-way signal processing path is controlled by a control circuit which produces a control signal based on a signal input from a control terminal, and the level shifter circuit is disposed in a stage after at least the first input buffer circuit in the one-way signal processing path;
  wherein the level shifter circuit includes a series inverter circuit comprising a serially connected member of the second and third inverters reversely connected in parallel between the first input buffer circuit and the second terminal; and
  wherein the signal conversion circuit further comprises:
  a fourth inverter serially disposed between the first terminal and the first input buffer circuit on the one-way signal processing path.

3. A signal level conversion circuit having voltage sources for supplying a first power voltage higher than a predetermined reference voltage and a second power voltage higher than the first power voltage, respectively, and comprising at least a first terminal for a signal of the first power voltage, a second terminal for a signal of the second power voltage, and a level shifter circuit which is disposed in a signal path between the first terminal and the second terminal to convert the signal of the first power voltage into the signal of the second power voltage, the circuit further comprising:
  a first input buffer circuit including a first inverter which is connected to the first terminal and a one-way device which is interposed between the first inverter and the first power voltage and which supplies a current from the first power voltage to the first inverter; and
  the level shifter circuit including second and third inverters which are interposed between an output of the first input buffer circuit and the second terminal and which use the second power voltage and which are connected in series, an input of the second inverter and an output of the third inverter being connected to the output of the first input buffer circuit,
  wherein a circuit threshold value of the second inverter is set to be lower than a voltage obtained by subtracting a voltage drop of the one-way device from the first power voltage;
  wherein the signal path constitutes a one-way signal processing path in which the first terminal is used as an input terminal and the second terminal is used as an output terminal, and one-way signal processing of the one-way signal processing path is controlled by a control circuit which produces a control signal based on a signal input from a control terminal, and the level shifter circuit is disposed in a stage after at least the first input buffer circuit in the one-way signal processing path;
  wherein the control circuit produces the control signal of the second power voltage based on a signal of the second power voltage inputted from the control terminal, and supplies the control signal of the second power voltage to the level shifter circuit and a first output buffer circuit interposed between the first level shifter circuit and the second terminal which is the output terminal.

4. The signal level conversion circuit according to claim 3, further comprising:
  a fourth inverter serially disposed between an input of the second inverter and the second terminal on the one-way signal processing path,
  wherein a circuit threshold value of the fourth inverter is set to be lower than a voltage obtained by subtracting the voltage drop of the one-way device from the first power voltage.

5. A signal level conversion circuit having voltage sources for supplying a first power voltage higher than a predetermined reference voltage and a second power voltage higher than the first power voltage, respectively, and comprising at least a first terminal for a signal of the first power voltage, a second terminal for a signal of the second power voltage, and a level shifter circuit which is disposed in a signal path between the first terminal and the second terminal to convert the signal of the first power voltage into the signal of the second power voltage, the circuit further comprising:
  a first input buffer circuit including a first inverter which is connected to the first terminal and a one-way device which is interposed between the first inverter and the first power voltage and which supplies a current from the first power voltage to the first inverter; and
  the level shifter circuit including second and third inverters which are interposed between an output of the first input buffer circuit and the second terminal and which use the second power voltage and which are connected in series, an input of the second inverter and an output of the third inverter being connected to the output of the first input buffer circuit,
  wherein a circuit threshold value of the second inverter is set to be lower than a voltage obtained by subtracting a voltage drop of the one-way device from the first power voltage;
  wherein the signal path constitutes a one-way signal processing path in which the first terminal is used as an input terminal and the second terminal is used as an output terminal, and one-way signal processing of the one-way signal processing path is controlled by a control circuit which produces a control signal based on a signal input from a control terminal, and the level shifter circuit is disposed in a stage after at least the first input buffer circuit in the one-way signal processing path; and
  wherein the control circuit comprises:
  a control section which produces a control signal of the first power voltage based on a signal of the first power voltage inputted from the control terminal; and a level shift section which shifts a level of the control signal of the first power voltage output from the control section to produce a control signal of the second power voltage, and supplies the control signal of the second power voltage to the level shifter circuit and a first output buffer circuit interposed between the first level shifter circuit and the second terminal.

6. The signal level conversion circuit according to claim 5, further comprising:
a fourth inverter serially disposed between an input of the second inverter and the second terminal on the one-way signal processing path,
wherein a circuit threshold value of the fourth inverter is set to be lower than a voltage obtained by subtracting the voltage drop of the one-way device from the first power voltage.

7. A signal level conversion circuit having voltage sources for supplying a first power voltage higher than a predetermined reference voltage and a second power voltage higher than the first power voltage, respectively, and comprising at least a first terminal for a signal of the first power voltage, a second terminal for a signal of the second power voltage, and a level shifter circuit which is disposed in a signal path between the first terminal and the second terminal to convert the signal of the first power voltage into the signal of the second power voltage, the circuit further comprising:
a first input buffer circuit comprising a first inverter including a first P-channel transistor and a first N-channel transistor whose gates are connected to the first terminal, and a one-way device which is interposed between the first P-channel transistor and the first power voltage and which supplies a current from the first power voltage to a source of the first P-channel transistor; and
the level shifter circuit comprising second and third inverters which are interposed between an output of the first input buffer circuit and the second terminal and which use the second power voltage and which are connected in series, an input of the second inverter and an output of the third inverter being connected to the output of the first input buffer circuit,
wherein a circuit threshold value of the second inverter is set to be lower than a voltage obtained by subtracting a voltage drop of the one-way device from the first power voltage;
wherein the signal path constitutes a one-way signal processing path in which the first terminal is used as an input terminal and the second terminal is used as an output terminal, and one-way signal processing of the one-way signal processing path is controlled by a control circuit which produces a control signal based on a signal input from a control terminal, and the level shifter circuit is disposed in a stage after at least the first input buffer circuit in the one-way signal processing path;
wherein the level shifter circuit includes a series inverter circuit comprising a serially connected member of the second and third inverters reversely connected in parallel between the first input buffer circuit and the second terminal; and
wherein a node between an output of the second inverter and an input of the third inverter is connected to the one-way signal processing path.

8. The signal level conversion circuit according to claim 7, further comprising:
a fourth inverter serially disposed between an input of the second inverter and the second terminal on the one-way signal processing path,
wherein a circuit threshold value of the fourth inverter is set to be lower than a voltage obtained by subtracting the voltage drop of the one-way device from the first power voltage.

9. A signal level conversion circuit having voltage sources for supplying a first power voltage higher than a predetermined reference voltage and a second power voltage higher than the first power voltage, respectively, and comprising at least a first terminal for a signal of the first power voltage, a second terminal for a signal of the second power voltage, and a level shifter circuit which is disposed in a signal path between the first terminal and the second terminal to convert the signal of the first power voltage into the signal of the second power voltage, the circuit further comprising:
a first input buffer circuit including a first inverter which is connected to the first terminal and a one-way device which is interposed between the first inverter and the first power voltage and which supplies a current from the first power voltage to the first inverter; and
the level shifter circuit including second and third inverters which are interposed between an output of the first input buffer circuit and the second terminal and which use the second power voltage and which are connected in series, an input of the second inverter and an output of the third inverter being connected to the output of the first input buffer circuit,
wherein a circuit threshold value of the second inverter is set to be lower than a voltage obtained by subtracting a voltage drop of the one-way device from the first power voltage; and
wherein the signal path comprises a bidirectional signal processing path including a first direction signal processing path in which the first terminal is used as an input terminal and the second terminal is used as an output terminal, and a second direction signal processing path in which the second terminal is used as an input terminal and the first terminal is used as an output terminal,
bidirectional signal processing of the bidirectional signal processing path is controlled by a control circuit which produces the first and second direction control signals based on an activating signal input from a control terminal and a processing direction indicating signal input from a direction indicating terminal, and
the level shifter circuit is disposed in a stage after at least the first input buffer circuit in the first direction signal processing path.

10. The signal level conversion circuit according to claim 9, wherein the first direction signal processing path comprises:
the first input buffer circuit into which a signal of a first power voltage is input via the first terminal constituting the input terminal; a first output buffer circuit which outputs a signal of a second power voltage via the second terminal constituting the output terminal; a level shifter circuit which is interposed between the first input buffer circuit and the first output buffer circuit and which shifts a level from the first power voltage to the second power voltage; and a first logic circuit disposed in a certain portion between the first terminal and the first output buffer circuit in the first direction signal processing path,
the second direction signal processing path comprises: a second input buffer circuit into which a signal of a second power voltage is input via the second terminal constituting the input terminal; a second output buffer circuit which outputs the signal of the second power voltage via the second terminal constituting the output terminal; and a second logic circuit disposed in a certain portion between the second terminal and the second output buffer circuit in the second direction signal processing path, and the control circuit inputs the activating signal and the processing direction indicating signal of the first or second power voltage, and produces a control signal of the second power voltage to control the first and second output buffer circuits.

11. The signal level conversion circuit according to claim 9, wherein the level shifter circuit includes a series inverter circuit comprising a serially connected member of the second and third inverters reversely connected in parallel between the first input buffer circuit and the second terminal.

12. The signal level conversion circuit according to claim 9, wherein a node between an output of the second inverter and an input of the third inverter is connected to the one-way signal processing path.

13. The signal conversion circuit according to claim 9, further comprising;

a fourth inverter serially disposed between an input of the second inverter and the second terminal on the one-way signal processing path, wherein a circuit threshold value of the fourth inverter is set to be lower than a voltage obtained by subtracting the voltage drop of the one-way device from the first power voltage.

14. The signal conversion circuit according to claim 9, further comprising;

a fourth inverter serially disposed between the first terminal and the first input buffer circuit on the one-way signal processing path.

* * * * *